(12) United States Patent
Pelrine et al.

(10) Patent No.: US 6,376,971 B1
(45) Date of Patent: Apr. 23, 2002

(54) ELECTROACTIVE POLYMER ELECTRODES

(75) Inventors: Ronald E. Pelrine, Boulder, CO (US);
Roy D. Kornbluh, Palo Alto, CA (US);
Qibing Pei, Fremont, CA (US); Jose P. Joseph, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 09/619,843

(22) Filed: Jul. 20, 2000

Related U.S. Application Data

(63) Continuation-in-part of application No. 09/356,801, filed on Jul. 19, 1999, which is a continuation of application No. PCT/US98/02311, filed on Feb. 2, 1998, application No. 09/619,843, filed on Jul. 20, 2000.

(60) Provisional application No. 60/037,400, filed on Feb. 7, 1997, provisional application No. 60/144,556, filed on Jul. 20, 1999, provisional application No. 60/153,329, filed on Sep. 10, 1999, provisional application No. 60/161,325, filed on Oct. 25, 1999, provisional application No. 60/181,404, filed on Feb. 9, 2000, provisional application No. 60/187,809, filed on Mar. 8, 2000, and provisional application No. 60/192,237, filed on Mar. 27, 2000.

(51) Int. Cl.⁷ .............................................. H01L 41/047
(52) U.S. Cl. ....................................................... 310/363
(58) Field of Search .................................. 310/363, 364

(56) References Cited

U.S. PATENT DOCUMENTS

| | | | |
|---|---|---|---|
| 4,384,394 A | 5/1983 | Lemonon et al. ........... 29/25.35 |
| 4,401,911 A | 8/1983 | Ravinet et al. ............. 310/820 |
| 4,518,555 A | 5/1985 | Ravinet et al. ............. 269/292 |
| 4,786,837 A | * 11/1988 | Kalnin et al. ................ 310/364 |
| 5,250,784 A | 10/1993 | Muller et al. .......... 219/121.72 |
| 5,350,966 A | * 9/1994 | Culp .......................... 310/328 |
| 5,361,240 A | * 11/1994 | Pearce ........................ 367/157 |
| 5,369,995 A | * 12/1994 | Scheinbeim et al. ..... 73/335.02 |
| 5,430,565 A | 7/1995 | Yamanouchi et al. ......... 359/73 |
| 5,814,921 A | * 9/1998 | Carroll ....................... 310/339 |
| 5,915,377 A | 6/1999 | Coffee .................. 128/200.16 |
| 6,048,622 A | 4/2000 | Hagood et al. ............. 128/461 |

FOREIGN PATENT DOCUMENTS

JP 61-239799 A * 12/1998 ............. G01L/1/16

* cited by examiner

*Primary Examiner*—Thomas M. Dougherty
(74) *Attorney, Agent, or Firm*—Beyer Weaver & Thomas LLP

(57) ABSTRACT

The present invention relates to electroactive polymers that are pre-strained to improve conversion from electrical to mechanical energy. When a voltage is applied to electrodes contacting a pre-strained polymer, the polymer deflects. This deflection may be used to do mechanical work. The pre-strain improves the mechanical response of an electroactive polymer. The present invention also relates to actuators including an electroactive polymer and mechanical coupling to convert deflection of the polymer into mechanical work. The present invention further relates to compliant electrodes that conform to the shape of a polymer. The present invention provides methods for fabricating electromechanical devices including one or more electroactive polymers.

22 Claims, 14 Drawing Sheets

ELECTROACTIVE POLYMER ELECTRODES

CROSS-REFERENCE TO RELATED APPLICATION

This application claims priority under 35 U.S.C. §119(e) from co-pending U.S. Provisional Patent Application No. 60/144,556 filed Jul. 20, 1999, naming R. E. Pelrine et al. as inventors, and titled "High-speed Electrically Actuated Polymers and Method of Use", which is incorporated by reference herein for all purposes; it also claims priority under 35 U.S.C. §119(e) from co-pending U.S. Provisional Patent Application No. 60/153,329 filed Sep. 10, 1999, naming R. E. Pelrine et al. as inventors, and titled "Electrostrictive Polymers As Microactuators", which is incorporated by reference herein for all purposes; it also claims priority under 35 U.S.C. §119(e) from co-pending U.S. Provisional Patent Application No. 60/161,325 filed Oct. 25, 1999, naming R. E. Pelrine et al. as inventors, and titled "Artificial Muscle Microactuators", which is incorporated by reference herein for all purposes; it also claims priority under 35 U.S.C. §119(e) from co-pending U.S. Provisional Patent Application No. 60/181,404 filed Feb. 9, 2000, naming R. D. Kornbluh et al. as inventors, and titled "Field Actuated Elastomeric Polymers", which is incorporated by reference herein for all purposes; it also claims priority under 35 U.S.C. §119(e) from co-pending U.S. Provisional Patent Application No. 60/187,809 filed Mar. 8, 2000, naming R. E. Pelrine et al. as inventors, and titled "Polymer Actuators and Materials", which is incorporated by reference herein for all purposes; and it also claims priority under 35 U.S.C. §119(e) from co-pending U.S. Provisional Patent Application No. 60/192,237 filed Mar. 27, 2000, naming R. D. Kornbluh et al. as inventors, and titled "Polymer Actuators and Materials II", which is incorporated by reference herein for all purposes; this application is also a continuation in part of co-pending U.S. Patent Application entitled "Elastomeric Dielectric Polymer Film Sonic Actuator" naming R. E. Pelrine et al. as inventors, filed on Jul. 19, 1999 (U.S. application Ser. No. 09/356,801), which claims priority from PCT/US98/02311 filed Feb. 2, 1998, which claims priority from U.S. Provisional Application Number 60/037,400 filed Feb. 7, 1997, all of which are incorporated by reference herein.

BACKGROUND OF THE INVENTION

The present invention relates generally to electroactive polymers that convert from electrical energy to mechanical energy. More particularly, the present invention relates to pre-strained polymers and their use in actuators and various applications. The present invention also relates to compliant electrodes used to electrically communicate with electroactive polymers and methods of fabricating pre-strained polymers.

In many applications, it is desirable to convert from electrical energy to mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines). These technologies are also not ideal when a large number of devices must be integrated into a single structure or under various performance conditions such as when high power density output is required at relatively low frequencies.

Several 'smart materials' have been used to convert between electrical and mechanical energy with limited success. These smart materials include piezoelectric ceramics, shape memory alloys and magnetostrictive materials. However, each smart material has a number of limitations that prevent its broad usage. Certain piezoelectric ceramics, such as lead zirconium titanate (PZT), have been used to convert electrical to mechanical energy. While having suitable efficiency for a few applications, these piezoelectric ceramics are typically limited to a strain below about 1.6 percent and are often not suitable for applications requiring greater strains than this. In addition, the high density of these materials often eliminates them from applications requiring low weight. Irradiated polyvinylidene difluoride (PVDF) is an electroactive polymer reported to have a strain of up to 4 percent when converting from electrical to mechanical energy. Similar to the piezoelectric ceramics, the PVDF is often not suitable for applications requiring strains greater than 4 percent. Shape memory alloys, such as nitinol, are capable of large strains and force outputs. These shape memory alloys have been limited from broad use by unacceptable energy efficiency, poor response time and prohibitive cost.

In addition to the performance limitations of piezoelectric ceramics and irradiated PVDF, their fabrication often presents a barrier to acceptability. Single crystal piezoelectric ceramics must be grown at high temperatures coupled with a very slow cooling down process. Irradiated PVDP must be exposed to an electron beam for processing. Both these processes are expensive and complex and may limit acceptability of these materials.

In view of the foregoing, alternative devices that convert from electrical to mechanical energy would be desirable.

SUMMARY OF THE INVENTION

In one aspect, the present invention relates to polymers that are pre-strained to improve conversion between electrical and mechanical energy. When a voltage is applied to electrodes contacting a pre-strained polymer, the polymer deflects. This deflection may be used to do mechanical work. The pre-strain improves the mechanical response of an electroactive polymer relative to a non-strained polymer. The pre-strain may vary in different directions of a polymer to vary response of the polymer to the applied voltage.

In another aspect, the present invention relates to actuators comprising an electroactive polymer and mechanical coupling to convert deflection of the polymer into mechanical output. Several actuators include mechanical coupling that improves the performance of an electroactive polymer.

In yet another aspect, the present invention relates to compliant electrodes that conform to the changing shape of a polymer. Many of the electrodes are capable of maintaining electrical communication at the high deflections encountered with pre-strained polymers of the present invention. In some embodiments, electrode compliance may vary with direction.

In another aspect, the present invention provides methods for fabricating electromechanical devices including one or more electroactive polymers. Pre-strain may be achieved by a number of techniques such as mechanically stretching a polymer and fixing the polymer to one or more solid members while it is stretched. Polymers of the present invention may be made by casting, dipping, spin coating, spraying or other known processes for fabrication of thin polymer layers. In one embodiment, a pre-strained polymer comprises a commercially available polymer that is pre-strained during fabrication.

In another aspect, the present invention relates to a transducer for translating from electrical energy to mechanical energy. The transducer includes at least two electrodes and a polymer arranged in a manner which causes a portion of the polymer to deflect in response to a change in electric field. The polymer is elastically pre-strained.

In another aspect, the present invention relates to a transducer for converting from electrical energy to mechanical energy. The transducer comprises at least two electrodes and a polymer arranged in a manner which causes a portion of the polymer to deflect in response to a change in electric field provided by the at least two electrodes. The portion of the polymer deflects with a maximum linear strain between about 50 percent and about 215 percent in response to the change in electric field.

In yet another aspect, the present invention relates to an actuator for converting electrical energy into displacement in a first direction. The actuator comprises at least one transducer. Each transducer comprises at least two electrodes and a polymer arranged in a manner which causes a portion of the polymer to deflect in response to a change in electric field. The actuator also comprises a flexible frame coupled to the at least one transducer, the frame providing mechanical assistance to improve displacement in the first direction.

In another aspect, the present invention relates to an actuator for converting electrical energy into mechanical energy. The actuator comprises a flexible member having fixed end and a free end, the flexible member comprising at least two electrodes and a pre-strained polymer arranged in a manner which causes a portion of the polymer to deflect in response to a change in electric field provided by the at least two electrodes.

In another aspect, the present invention relates to an actuator for converting electrical energy into displacement in a first direction. The actuator comprises at least one transducer. Each transducer comprises at least two electrodes and a polymer arranged in a manner which causes a portion of the polymer to deflect in response to a change in electric field. The actuator also comprises at least one stiff member coupled to the at least one transducer, the at least one stiff member substantially preventing displacement in a second direction.

In yet another aspect, the present invention relates to a diaphragm actuator for converting electrical energy into mechanical energy. The actuator comprises at least one transducer. Each transducer comprises at least two electrodes and a pre-strained polymer arranged in a manner which causes a first portion of the polymer to deflect in response to a change in electric field. The actuator also comprises a frame attached to a second portion of the polymer, the frame including at least one circular hole, wherein the first portion deflects out of the plane of the at least one circular hole in response to the change in electric field.

In another aspect, the present invention relates to an actuator for converting electrical energy into mechanical energy, the actuator comprising a body having at least one degree of freedom between a first body portion and a second body portion, the body including at least one transducer attached to the first portion and the second portion, each transducer comprising at least two electrodes and a pre-strained polymer arranged in a manner which causes a portion of the polymer to deflect in response to a change in electric field; the actuator also comprising a first clamp attached to the first body portion and a second clamp attached to the second body portion.

In yet another aspect, the present invention relates to an actuator for converting electrical energy to mechanical energy, the actuator comprising a transducer, the transducer comprising a polymer arranged in a manner which causes a first portion of the polymer to deflect in response to a change in electric field, a first electrode pair configured to actuate a second portion of the polymer and a second electrode pair configured to actuate a third portion of the polymer, the actuator also comprising an output member coupled to a first portion of the polymer.

In another aspect, the present invention relates to an electrode for use with an electroactive polymer. The electrode comprises a compliant portion in contact with the electroactive polymer, wherein the compliant portion is capable of deflection with a strain of at least about 50 percent.

In yet another aspect, the present invention relates to an electrode for use with an electroactive polymer. The electrode comprising a compliant portion in contact with the electroactive polymer, wherein the electrode comprises an opacity which varies with deflection.

In yet another aspect, the present invention relates to an electrode for use with an electroactive polymer. The electrode comprising a compliant portion in contact with the electroactive polymer, wherein the compliant portion comprises a textured surface.

In another aspect, the present invention relates to a method of fabricating a transducer including a pre-strained polymer. The method comprises pre-straining an electroactive polymer to form the pre-strained polymer. The method also comprises fixing a portion of the pre-strained polymer to a solid member. The method additionally comprises forming one or more electrodes on the pre-strained polymer.

In still another aspect, the present invention relates to a method of fabricating a transducer comprising multiple pre-strained polymers. The method comprises pre-straining a first polymer to form a first pre-strained polymer. The method also comprises forming one or more electrodes on the first pre-strained polymer. The method further comprises pre-straining a second polymer to form a second pre-strained polymer. The method additionally comprises forming one or more electrodes on the second pre-strained polymer. The method further comprises coupling the first pre-strained polymer to the second pre-strained polymer.

These and other features and advantages of the present invention will be described in the following description of the invention and associated figures.

DETAILED DESCRIPTION OF THE PREFERRED EMBODIMENTS

Figure 1A:
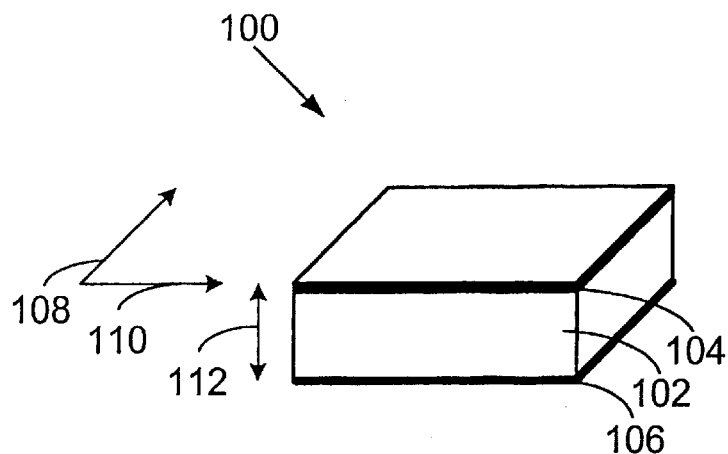
FIGS. 1A and 1B illustrate a top perspective view of a transducer before and after application of a voltage in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. OVERVIEW

Electroactive polymers deflect when actuated by electrical energy. In one embodiment, an electroactive polymer refers to a polymer that acts as an insulating dielectric between two electrodes and may deflect upon application of a voltage difference between the two electrodes. In one aspect, the present invention relates to polymers that are pre-strained to improve conversion between electrical and mechanical energy. The pre-strain improves the mechanical response of an electroactive polymer relative to a non-strained electroactive polymer. The improved mechanical response enables greater mechanical work for an electroactive polymer, e.g., larger deflections and actuation pressures. For example, linear strains of at least about 200 percent and area strains of at least about 300 percent are possible with pre-strained polymers of the present invention. The pre-strain may vary in different directions of a polymer. Combining directional variability of the pre-strain, different ways to constrain a polymer, scalability of electroactive polymers to both micro and macro levels, and different polymer orientations (e.g., rolling or stacking individual polymer layers) permits a broad range of actuators that convert electrical energy into mechanical work. These actuators find use in a wide range of applications.

As the electroactive polymers of the present invention may deflect at linear strains of at least about 200 percent, electrodes attached to the polymers should also deflect without compromising mechanical or electrical performance. Correspondingly, in another aspect, the present invention relates to compliant electrodes that conform to the shape of an electroactive polymer they are attached to. The electrodes are capable of maintaining electrical communication even at the high deflections encountered with pre-strained polymers of the present invention. By way of example, strains of at least about 50 percent are common with electrodes of the present invention. In some embodiments, compliance provided by the electrodes may vary with direction.

As the pre-strained polymers are suitable for use in both the micro and macro scales, in a wide variety of actuators and in a broad range of applications, fabrication processes used with the present invention vary greatly. In another aspect, the present invention provides methods for fabricating electromechanical devices including one or more pre-strained polymers. Pre-strain may be achieved by a number of techniques such as mechanically stretching an electroactive polymer and fixing the polymer to one or more solid members while it is stretched.

2. GENERAL STRUCTURE OF DEVICES

Figure 1B:
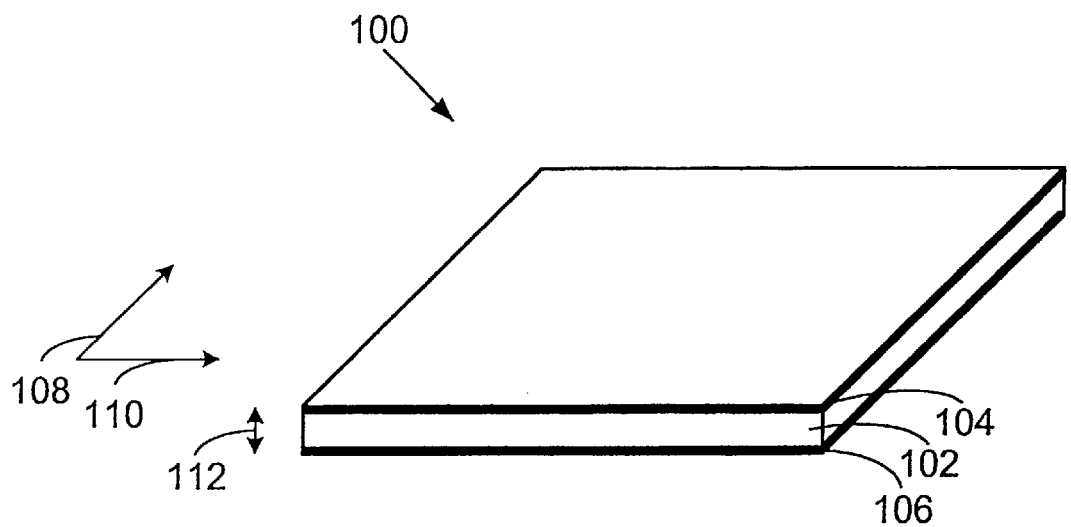

FIGS. 1A and 1B illustrate a top perspective view of a transducer 100 in accordance with one embodiment of the present invention. The transducer 100 includes a polymer 102 for translating between electrical energy and mechanical energy. Top and bottom electrodes 104 and 106 are attached to the electroactive polymer 102 on its top and bottom surfaces respectively to provide a voltage difference across a portion of the polymer 102. The polymer 102 deflects with a change in electric field provided by the top and bottom electrodes 104 and 106. Deflection of the transducer 100 in response to a change in electric field provided by the electrodes 104 and 106 is referred to as actuation. As the polymer 102 changes in size, the deflection may be used to produce mechanical work.

FIG. 1B illustrates a top perspective view of the transducer 100 including deflection in response to a change in electric field. Generally speaking, deflection refers to any displacement, expansion, contraction, torsion, linear or area strain, or any other deformation of a portion of the polymer 102. The change in electric field corresponding to the voltage difference produced by the electrodes 104 and 106 produces mechanical pressure within the pre-strained polymer 102. In this case, the unlike electrical charges produced by the electrodes 104 and 106 are attracted to each other and provide a compressive force between the electrodes 104 and 106 and an expansion force on the polymer 102 in planar directions 108 and 110, causing the polymer 102 to compress between the electrodes 104 and 106 and stretch in the planar directions 108 and 110.

In some cases, the electrodes 104 and 106 cover a limited portion of the polymer 102 relative to the total area of the polymer. This may done to prevent electrical breakdown around the edge of polymer 102 or achieve customized deflections in certain portions of the polymer. As the term is used herein, an active region is defined as a portion of the polymer material 102 having sufficient electrostatic force to enable deflection of the portion. As will be described below, a polymer of the present invention may have multiple active regions. Polymer 102 material outside an active area may act as an external spring force on the active area during deflection. More specifically, material outside the active area may resist active area deflection by its contraction or expansion. Removal of the voltage difference and the induced charge causes the reverse effects.

The electrodes 104 and 106 are compliant and change shape with the polymer 102. The configuration of the polymer 102 and the electrodes 104 and 106 provides for increasing polymer 102 response with deflection. More specifically, as the transducer 100 deflects, compression of the polymer 102 brings the opposite charges of the electrodes 104 and 106 closer and stretching of the polymer 102 separates similar charges in each electrode. In one embodiment, one of the electrodes 104 and 106 is ground.

Generally speaking, the transducer 100 continues to deflect until mechanical forces balance the electrostatic forces driving the deflection. The mechanical forces include elastic restoring forces of the polymer 102 material, the compliance of the electrodes 104 and 106, and any external resistance provided by a device and/or load coupled to the transducer 100. The resultant deflection of the transducer 100 as a result of the applied voltage may also depend on a number of other factors such as the polymer 102 dielectric constant and the polymer 102 size.

Electroactive polymers in accordance with the present invention are capable of deflection in any direction. After application of the voltage between the electrodes 104 and 106, the electroactive polymer 102 increases in size in both planar directions 108 and 110. In some cases, the electroactive polymer 102 is incompressible, e.g. has a substantially constant volume under stress. In this case, the polymer 102 decreases in thickness as a result of the expansion in the planar directions 108 and 110. It should be noted that the present invention is not limited to incompressible polymers and deflection of the polymer 102 may not conform to such a simple relationship.

The electroactive polymer 102 is pre-strained. The pre-strain improves conversion between electrical and mechanical energy. In one embodiment, pre-strain improves the dielectric strength of the polymer. For the transducer 100, the pre-strain allows the electroactive polymer 102 to deflect more and provide greater mechanical work. Pre-strain of a polymer may be described in one or more directions as the change in dimension in that direction after pre-straining relative to the dimension in that direction before pre-straining. The pre-strain may comprise elastic deformation of the polymer 102 and be formed, for example, by stretching the polymer in tension and fixing one or more of the edges while stretched. In one embodiment, the pre-strain is elastic. After actuation, an elastically pre-strained polymer could, in principle, be unfixed and return to its original state. The pre-strain may be imposed at the boundaries using a rigid frame or may be implemented locally for a portion of the polymer.

In one embodiment, pre-strain is applied uniformly over a portion of the polymer 102 to produce an isotropic pre-strained polymer. By way of example, an acrylic elastomeric polymer may be stretched by 200–400 percent in both planar directions. In another embodiment, pre-strain is applied unequally in different directions for a portion of the polymer 102 to produce an anisotropic pre-strained polymer. In this case, the polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, the majority of deflection occurs in the low pre-strain direction. In one embodiment, the transducer 100 enhances deflection in the direction 108 by exploiting large pre-strain in the perpendicular direction 110. By way of example, an acrylic elastomeric polymer used as the transducer 100 may be stretched by 100 percent in the direction 108 and by 500 percent in the perpendicular direction 110. Construction of the transducer 100 and geometric edge constraints may also affect directional deflection as will be described below with respect to actuators.

The quantity of pre-strain for a polymer may be based on the electroactive polymer and the desired performance of the polymer in an actuator or application. For some polymers of the present invention, pre-strain in one or more directions may range from –100 percent to 600 percent. By way of example, for a VHB acrylic elastomer having isotropic pre-strain, pre-strains of at least about 100 percent, and preferably between about 200–400 percent, may be used in each direction. In one embodiment, the polymer is pre-strained by a factor in the range of about 1.5 times to 50 times the original area. For an anisotropic acrylic pre-strained to enhance actuation in a compliant direction, pre-strains between about 400–500 percent may be used in the stiffened direction and pre-strains between about 20–200 percent may be used in the compliant direction. In some cases, pre-strain may be added in one direction such that a negative pre-strain occurs in another direction, e.g. 600 percent in one direction coupled with –100 percent in an orthogonal direction. In these cases, the net change in area due to the pre-strain is typically positive.

Pre-strain may affect other properties of the polymer 102. Large pre-strains may change the elastic properties of the polymer and bring it into a stiffer regime with lower viscoelastic losses. For some polymers, pre-strain increases the electrical breakdown strength of the polymer 102, which allows for higher electric fields to be used within the polymer—permitting higher actuation pressures and higher deflections.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least about 100 percent are possible for pre-strained polymers of the present invention. For some pre-strained polymers, maximum area strains in the range of 70 to 330 percent are common.

Generally, after the polymer is pre-strained, it may be fixed to one or more objects. Each object may be suitably stiff to maintain the level of pre-strain desired in the polymer. The polymer may be fixed to the one or more objects according to any conventional method known in the art such as a chemical adhesive, an adhesive layer or material, mechanical attachment, etc.

Transducers and pre-strained polymers of the present invention are not limited to any particular geometry or linear deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated. In another embodiment, a transducer that deflects radially out of the plane is referred to as a diaphragm. A diaphragm actuator will be described in more detail with respect to FIGS. 1E and 1F.

Transducers (including methods of using them and methods of fabricating them) in accordance with the present invention are described in reports available from the New Energy and Industrial Technology Development Organization (NEDO) offices under the reference title "Annual Research Progress Report for R&D of Micromachine Technology (R&D of High Functional Maintenance System for Power Plant Facilities)" for 1999, the "Annual Research Progress Report for R&D of Micromachine Technology (R&D of High Functional Maintenance System for Power Plant Facilities)" for 1998, the "Annual Research Progress Report for R&D of Micromachine Technology (R&D of High Functional Maintenance System for Power Plant Facilities)" for 1997, or the "Annual Research Progress Report for R&D of Micromachine Technology (R&D of High Functional Maintenance System for Power Plant Facilities)" for 1996, all of which are incorporated herein for all purposes. NEDO has several offices in Japan in addition to other offices in the United States, Australia, France, Thailand and China.

Figure 1C:
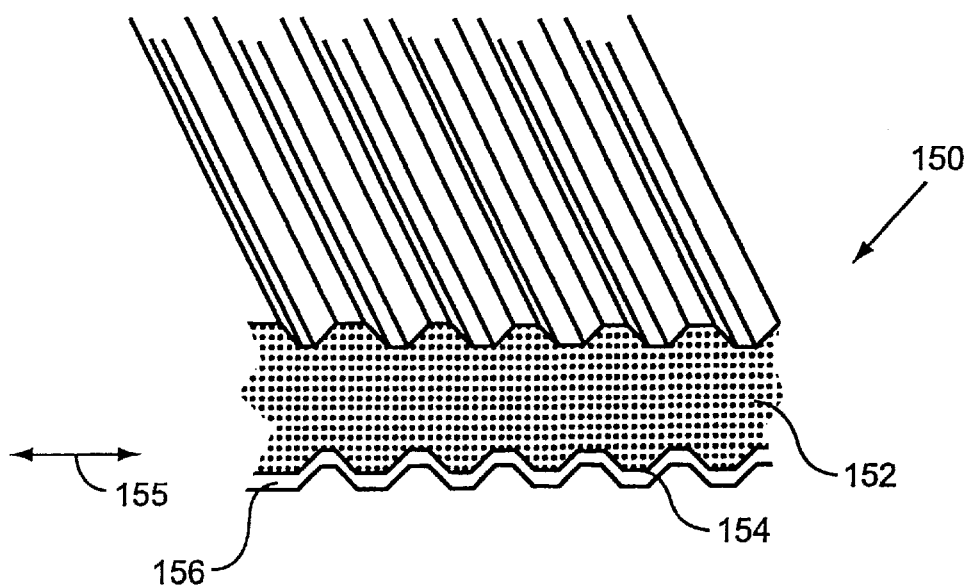
FIG. 1C illustrates a textured surface for an electroactive polymer having a wavelike profile.

Electroactive polymers in accordance with one embodiment of the present invention may include a textured surface. FIG. 1C illustrates a textured surface 150 for an electroactive polymer 152 having a wavelike profile. The textured surface 150 allows the polymer 152 to deflect using bending of surface waves 154. Bending of the surface waves 154 provides directional compliance in a direction 155 with less resistance than bulk stretching for a stiff electrode attached to the polymer 152 in the direction 155. The textured surface 150 may be characterized by troughs and crests, for example, about 0.1 micrometer to 40 micrometers wide and about 0.1 micrometers to 20 micrometers deep. In this case, the wave width and depth is substantially less than the thickness of the polymer. In a specific embodiment, the troughs and crests are approximately 10 micrometers wide and six micrometers deep on a polymer layer with a thickness of 200 micrometers.

In one embodiment, a thin layer of stiff material 156, such as an electrode, is attached to the polymer 152 to provide the wavelike profile. During fabrication, the electroactive polymer is stretched more than it can stretch when actuated, and the thin layer of stiff material 156 is attached to the stretched polymer 152 surface. Subsequently, the polymer 152 is relaxed and the structure buckles to provide the textured surface.

Figure 1D:
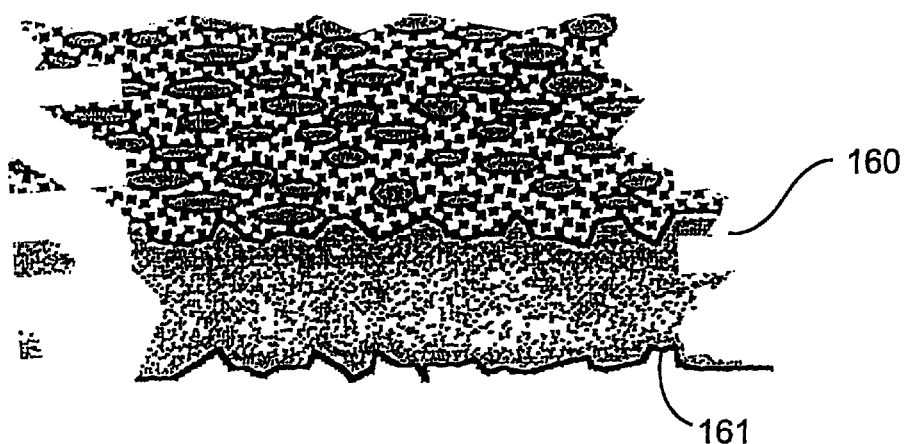
FIG. 1D illustrates an electroactive polymer including a textured surface having random texturing.

In general, a textured surface may comprise any non-uniform or non-smooth surface topography that allows a polymer to deflect using deformation in the polymer surface. By way of example, FIG. 1D illustrates an electroactive polymer 160 including a roughened surface 161 having random texturing. The roughened surface 160 allows for planar deflection that is not directionally compliant. Advantageously, deformation in surface topography may allow deflection of a stiff electrode with less resistance than bulk stretching or compression. It should be noted that deflection of a pre-strained polymer having a textured surface may comprise a combination of surface deformation and bulk stretching of the polymer.

Textured or non-uniform surfaces for the polymer may also allow the use of a barrier layer and/or electrodes that rely on deformation of the textured surfaces. The electrodes may include metals that bend according to the geometry of the polymer surface. The barrier layer may be used to block charge in the event of local electrical breakdown in the pre-strained polymer material.

Materials suitable for use as a pre-strained polymer with the present invention may include any substantially insulating polymer or rubber that deforms in response to an electrostatic force or whose deformation results in a change in electric field. One suitable material is NuSil CF19-2186 as provided by NuSil Technology of Carpenteria, Calif. Other exemplary materials suitable for use as a pre-strained polymer include, any dielectric elastomeric polymer, silicone rubbers, fluoroelastomers, silicones such as Dow Corning HS3 as provided by Dow Corning of Wilmington, Del., fluorosilicones such as Dow Corning 730 as provided by Dow Corning of Wilmington, Del., etc, and acrylic polymers such as any acrylic in the 4900 VHB acrylic series as provided by 3M Corp. of St. Paul, Minn.

In many cases, materials used in accordance with the present invention are commercially available polymers. The commercially available polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may simplify fabrication. In one embodiment, the commercially available polymer is a commercially available acrylic elastomer comprising mixtures of aliphatic acrylate that are photocured during fabrication. The elasticity of the acrylic elastomer results from a combination of the branched aliphatic groups and cross-linking between the acrylic polymer chains.

Materials used as a pre-strained polymer may be selected based on one or more material properties such as a high electrical breakdownstrength, a low modulus of elasticity—for large or small deformations, a high dielectric constant, etc. In one embodiment, the polymer is selected such that is has an elastic modulus below 100 MPa. In another embodiment, the polymer is selected such that is has a maximum actuation pressure between about 0.05 MPa and about 10 MPa, and preferably between about 0.3 MPa and about 3 MPa. In another embodiment, the polymer is selected such that is has a dielectric constant between about 2 and about 20, and preferably between about 2.5 and about 12. For some applications, an electroactive polymer is selected based on one or more application demands such as a wide temperature and/or humidity range, repeatability, accuracy, low creep, reliability and endurance.

Suitable actuation voltages for pre-strained polymers of the present invention may vary based on the electroactive polymer material and its properties (e.g. the dielectric constant) as well as the dimensions of the polymer (e.g. the thickness between electrodes). By way of example, actuation electric fields for the polymer 102 in FIG. 1A may range in magnitude from about 0 V/m to 440 MegaVolts/meter. Actuation voltages in this range may produce a pressure in the range of about 0 Pa to about 10 MPa. To achieve a transducer capable of higher forces, the thickness of the polymer may be increased. Alternatively, multiple polymer layers may be implemented. Actuation voltages for a particular polymer may be reduced by increasing the dielectric constant, decreasing polymer thickness and decreasing the modulus of elasticity, for example.

Pre-strained polymers of the present invention may cover a wide range of thicknesses. In one embodiment, polymer thickness may range between about 1 micrometerand 2 millimeters. Typical thicknesses before pre-strain include 50–225 micrometers for HS3, 25–75 micrometers for NuSil CF 19-2186, and 100–1000 micrometers for any of the 3M VHB 4900 series acrylic polymers. Polymer thickness may be reduced by stretching the film in one or both planar directions. In many cases, pre-strained polymers of the present invention may be fabricated and implemented as thin films. Thicknesses suitable for these thin films may be below 50 micrometers.

3. ACTUATORS

The deflection of a pre-strained polymer can be used in a variety of ways to produce mechanical energy. Generally speaking, electroactive polymers of the present invention may be implemented with a variety of actuators—including conventional actuators retrofitted with a pre-strained polymer and custom actuators specially designed for one or more pre-strained polymers. Conventional actuators include extenders, bending beams, stacks, diaphragms, etc. Several different exemplary custom actuators in accordance with the present invention will now be discussed.

Figure 1E:
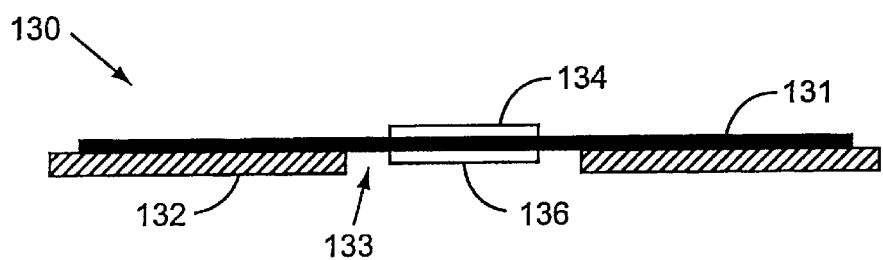
FIG. 1E illustrates a cross-sectional side view of a diaphragm actuator including an electroactive polymer before application of a voltage in accordance with one embodiment of the present invention.

FIG. 1E illustrates a cross-sectional side view of a diaphragm actuator 130 including a pre-strained polymer 131 before actuation in accordance with one embodiment of the present invention. The pre-strained polymer 131 is attached to a frame 132. The frame 132 includes a circular hole 133 that allows deflection of the polymer 131 perpendicular to the area of the circular hole 133. The diaphragm actuator 130 includes circular electrodes 134 and 136 on either side of the polymer 131 to provide a voltage difference across a portion of the polymer 131.

Figure 1F:
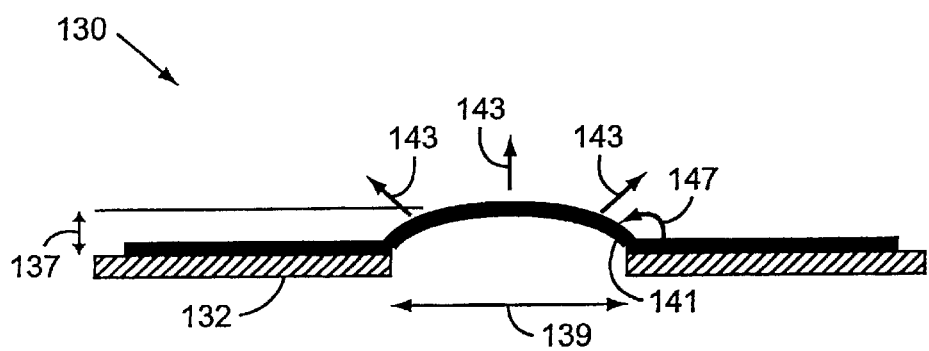
FIG. 1F illustrates a cross-sectional view of the electroactive polymer diaphragm of FIG. 1E after application of a voltage in accordance with one embodiment of the present invention.

In the voltage-off configuration of FIG. 1E, the polymer 131 is stretched and secured to the frame 132 with tension to achieve pre-strain. Upon application of a suitable voltage to the electrodes 134 and 136, the polymer film 131 expands away from the plane of the frame 132 as illustrated in FIG. 1F. The electrodes 134 and 136 are compliant and change shape with the pre-strained polymer 131 as it deflects.

The diaphragm actuator 130 is capable of expansion in both directions away from the plane. In one embodiment, the bottom side 141 of the polymer 131 includes a bias pressure that influences the expansion of the polymer film 131 to continually actuate upward in the direction of arrows 143 (FIG. 1F). In another embodiment, a swelling agent such as a small amount of silicone oil is applied to the bottom side 141 to influence the expansion of the polymer 131 in the direction of arrows 143. The swelling agent causes slight permanent deflection in one direction as determined during fabrication, e.g. by supplying a slight pressure on the bottom side 141 when the swelling agent is applied. The swelling agent allows the diaphragm to continually actuate in a desired direction without using a bias pressure.

The amount of expansion for the diaphragm actuator 130 will vary based on a number of factors including the polymer 131 material, the applied voltage, the amount of pre-strain, any bias pressure, compliance of the electrodes 134 and 136, etc. In one embodiment, the polymer 131 is capable of deflections to a height 137 of at least about 50 percent of the hole diameter 139 and may take a hemispheric shape at large deflections. In this case, an angle 147 formed between the polymer 131 and the frame 132 may be less than 90 degrees.

As mentioned earlier, expansion in one direction of an electroactive polymer may induce contractile stresses in a second direction such as due to Poisson effects. This may reduce the mechanical output for a transducer that provides mechanical output in the second direction. Correspondingly, actuators of the present invention may be designed to constrain a polymer in the non-output direction. In some cases, actuators may be designed to improve mechanical output using deflection in the non-output direction.

Figure 2H:
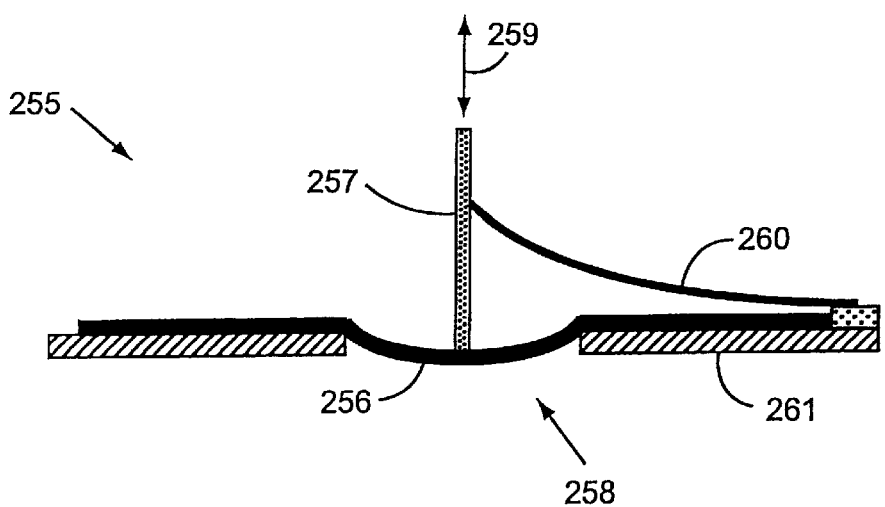
FIG. 2H illustrates a linear actuator comprising an electroactive polymer diaphragm in accordance with another embodiment of the present invention.
Figure 2A:
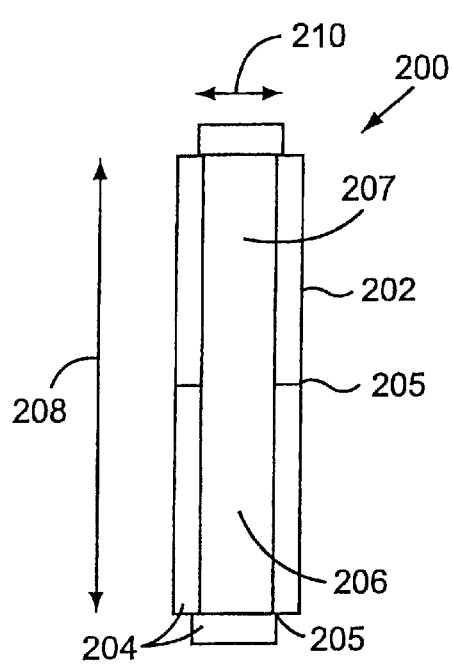
FIG. 2A and FIG. 2B illustrate a bow actuator before and after actuation in accordance with a specific embodiment of the present invention.
Figure 2B:
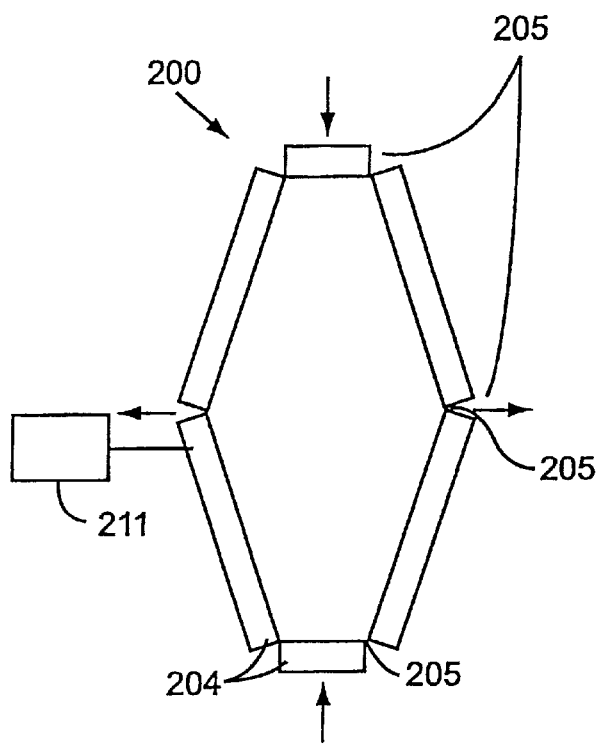

An actuator which uses deflection in one planar direction to improve mechanical output in the other planar direction is a bow actuator. FIGS. 2A and 2B illustrate a bow actuator 200 before and after actuation in accordance with a specific embodiment of the present invention. The bow actuator 200 is a planar mechanism comprising a flexible frame 202 which provides mechanical assistance to improve mechanical output for a polymer 206 attached to the frame 202. The frame 202 includes six rigid members 204 connected at joints 205. The members 204 and joints 205 provide mechanical assistance by coupling polymer deflection in a planar direction 208 into mechanical output in a perpendicular planar direction 210. More specifically, the frame 202 is arranged such that a small deflection of the polymer 206 in the direction 208 improves displacement in the perpendicular planar direction 210. Attached to opposite (top and bottom) surfaces of the polymer 206 are electrodes 207 (bottom electrode on bottom side of polymer 206 not shown) to provide a voltage difference across a portion of the polymer 206.

The polymer 206 is configured with different levels of pre-strain in its orthogonal directions. More specifically, the electroactive polymer 206 includes a high pre-strain in the planar direction 208, and little or no pre-strain in the perpendicular planar direction 210. This anisotropic pre-strain is arranged relative to the geometry of the frame 202. More specifically, upon actuation across electrodes 207 and 209, the polymer contracts in the high pre-strained direction 208. With the restricted motion of the frame 202 and the lever arm provided by the members 204, this contraction helps drive deflection in the perpendicular planar direction 210. Thus, even for a short deflection of the polymer 206 in the high pre-strain direction 208, the frame 202 bows outward in the direction 210. In this manner, a small contraction in the high pre-strain direction 210 becomes a larger expansion in the relatively low pre-strain direction 208.

Using the anisotropic pre-strain and constraint provided by the frame 202, the bow actuator 200 allows contraction in one direction to enhance mechanical deflection and electrical to mechanical conversion in another. In other words, a load 211 (FIG. 2B) attached to the bow actuator 200 is coupled to deflection of the polymer 206 in two directions—direction 208 and 210. Thus, as a result of the differential pre-strain of the polymer 206 and the geometry of the frame 202, the bow actuator 200 is able to provide a larger mechanical displacement than an electroactive polymer alone for common electrical input.

The bow actuator 200 may be configured based on the polymer 206. By way of example, the geometry of the frame 202 and dimensions of the polymer 206 may be adapted based on the polymer 206 material. In a specific embodiment using HS3 silicone as the polymer 206, the polymer 206 preferably has a ratio in directions 208 and 210 of 9:2 with pre-strains about 270 percent and −25 percent in the directions 208 and 210 respectively. Using this arrangement, linear strains of at least about 100 percent in direction 210 are possible.

The pre-strain in the polymer 206 and constraint provided by the frame 202 may also allow the bow actuator 200 to utilize lower actuation voltages for the pre-strained polymer 206 for a given deflection. As the bow actuator 200 has a lower effective modulus of elasticity in the low pre-strained direction 210, the mechanical constraint provided by the frame 202 allows the bow actuator 200 to be actuated in the direction 210 to a larger deflection with a lower voltage. In addition, the high pre-strain in the direction 208 increases the breakdown strength of the polymer 206, permitting higher voltages and higher deflections for the bow actuator 200.

As mentioned earlier with respect FIG. 1A, when a polymer expands as a result of electrostatic forces, it continues to expand until mechanical forces balance the electrostatic pressure driving the expansion. When the load 211 is attached to the bow actuator 200, mechanical effects provided by the load 211 will influence the force balance and deflection of the polymer 206. For example, if the load 211 resists expansion of the bow actuator 200, then the polymer 206 may not expand as much as if were there no load.

Figure 2C:
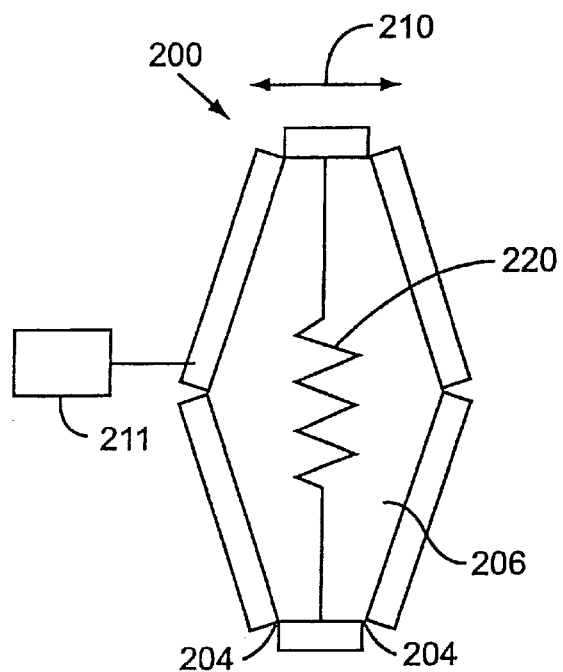
FIG. 2C illustrates a bow actuator including additional components to improve deflection in accordance with a specific embodiment of the present invention.

In one embodiment, the bow actuator 200 may include additional components to provide mechanical assistance and enhance mechanical output. By way of example, springs 220 as shown in FIG. 2C may be attached to the bow actuator 200 to enhance deflection in the direction 210. The springs load the bow actuator 200 such that the spring force exerted by the springs opposes resistance provided by an external load. In some cases, the springs 220 provide increasing assistance for bow actuator 200 deflection. In one embodiment, spring elements may be built into the joints 205 instead of the external springs 220 to enhance deflection of the bow actuator 200. In addition, pre-strain may be increased to enhance deflection. The load may also be coupled to the rigid members 204 on top and bottom of the frame 202 rather than on the rigid members of the side of the frame 202 (as shown in FIG. 2B). Since the top and bottom rigid members 204 contract towards each other when voltage is applied as shown in FIG. 2B, the bow actuator 200 provides an exemplary device contracts in the plane upon application of a voltage rather than expands.

Although the bow actuator 200 of FIGS. 2A–2C illustrates a specific example of a custom actuator including a flexible frame and an electroactive polymer, any frame geometry or mechanical assistance to improve displacement of an electroactive polymer is suitable for use with the present invention.

The shape and constraint of the polymer may affect deflection. An aspect ratio for an electroactive polymer is defined as the ratio of its length to width. If the aspect ratio is high (e.g., an aspect ratio of at least about 4:1) and the polymer is constrained along its length by rigid members, than the combination may result in a substantially one dimensional deflection in the width direction.

Figure 2D:
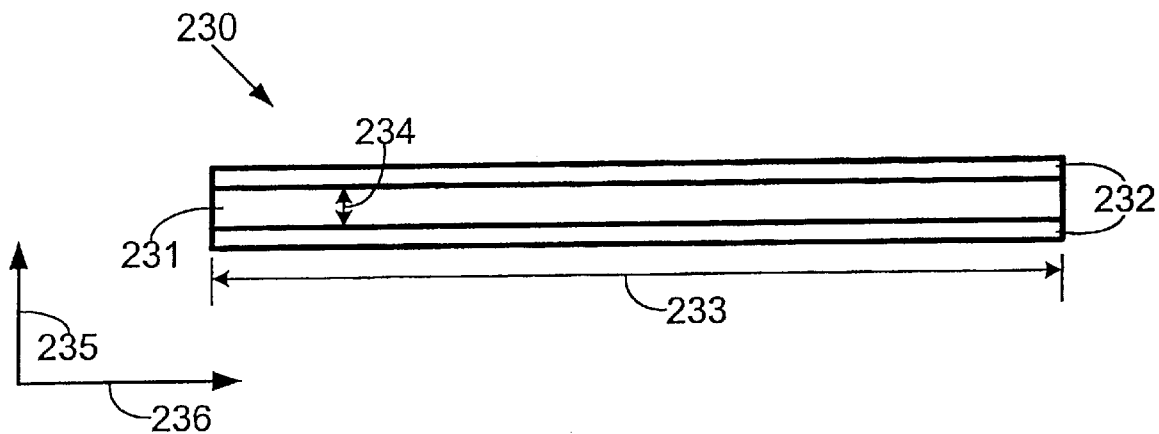
FIGS. 2D and 2E illustrate a linear motion actuator before and after actuation in accordance with a specific embodiment of the present invention.
Figure 2E:
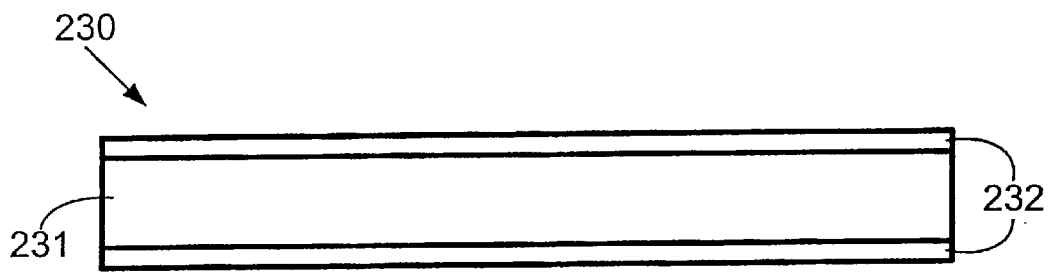

FIGS. 2D and 2E illustrate a linear motion actuator 230 before and after actuation in accordance with a specific embodiment of the present invention. The linear motion actuator 230 is a planar mechanism providing mechanical output in one direction. The linear motion actuator 230 comprises a polymer 231 having a length 233 substantially greater than its width 234 (e.g., an aspect ratio of at least about 4:1). The polymer 231 is attached on opposite sides to stiff members 232 of a frame along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in a direction 235. When the linear motion actuator 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result. By way of example, such an arrangement may produce linear strains of at least about 200 percent for acrylics having an anisotropic pre-strain.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion actuators 230 may be combined in series in the direction 235 to form an actuator having a cumulative deflection of all the linear motion actuators in the series. When transducing electric energy into mechanical energy, electroactive polymers—either individually or mechanically linked in a collection—may be referred to as 'artificial muscle'. For purposes herein, artificial muscle is defined as one or more transducers and/or actuators having a single output force and/or displacement. Artificial muscle may be implemented on a micro or macro level and may comprise any one or more of the actuators described herein.

Figure 2F:
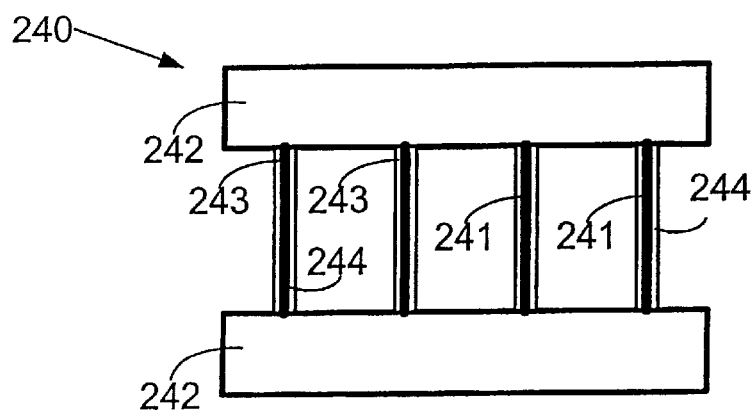
FIG. 2F illustrates a cross-sectional side view of an actuator including multiple polymer layers in accordance with one embodiment of the present invention.

FIG. 2F illustrates cross-sectional side view of a multilayer actuator 240 as an example of artificial muscle in accordance with a specific embodiment of the present invention. The multilayer actuator 240 includes four pre-strained polymers 241 arranged in parallel and each attached to a rigid frame 242 such that they have the same deflection. Electrodes 243 and 244 are deposited on opposite surfaces of each polymer 241 and provide simultaneous electrostatic actuation to the four pre-strained polymers 241. The multilayer actuator 240 provides cumulative force output of the individual polymer layers 241.

Figure 2G:
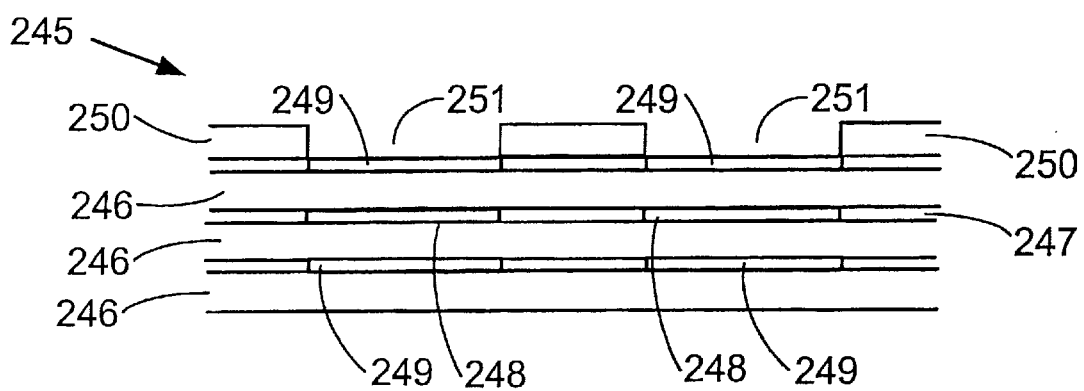
FIG. 2G illustrates a stacked multilayer actuator as an example of artificial muscle in accordance with one embodiment of the present invention.

In another embodiment, multiple electroactive polymer layers may be used in place of one polymer to increase the force or pressure output of an actuator. For example, ten electroactive polymers may be layered to increase the pressure output of the diaphragm actuator of FIG. 1E. FIG. 2G illustrates such a stacked multilayer diaphragm actuator 245 as another example of artificial muscle in accordance with one embodiment of the present invention. The stacked multilayer actuator 245 includes three polymer layers 246 layered upon each other and may be attached by adhesive layers 247. Within the adhesive layers 247 are electrodes 248 and 249 that provide actuation to polymer layers 246. A relatively rigid plate 250 is attached to the outermost polymer layer and patterned to include holes 251 that allow deflection for the stacked multilayer diaphragm actuator 245. By combining the polymer layers 246, the stacked multilayer actuator 245 provides cumulative force output of the individual polymer layers 246.

In addition to the linear motion actuator 230 of FIGS. 2D and 2E, electroactive polymers of the present invention may be included in a variety of actuators that provide linear displacement. FIG. 2H illustrates a linear actuator 255 comprising an electroactive polymer diaphragm 256 in accordance with another embodiment of the present invention. In this case, an output shaft 257 is attached to a central portion of the diaphragm 256 that deflects in a hole 258 of a frame 261. Upon actuation and removal of electrostatic energy, the output shaft 257 translates as indicated by arrow 259. The linear actuator 255 may also include a compliant spring element 260 that helps position the output shaft 257.

In another embodiment, pre-strained polymers of the present invention may be rolled or folded into linear transducers and actuators that deflect axially upon actuation. As fabrication of electroactive polymers is often simplest with fewer numbers of layers, rolled actuators provide an efficient manner of squeezing large layers of polymer into a compact shape. Rolled or folded transducers and actuators may include one or more layers of polymer rolled or folded to provide numerous layers of polymer adjacent to each other. Rolled or folded actuators are applicable wherever linear actuators are used, such as robotic legs and fingers, high force grippers, and general-purpose linear actuators.

Figure 2I:
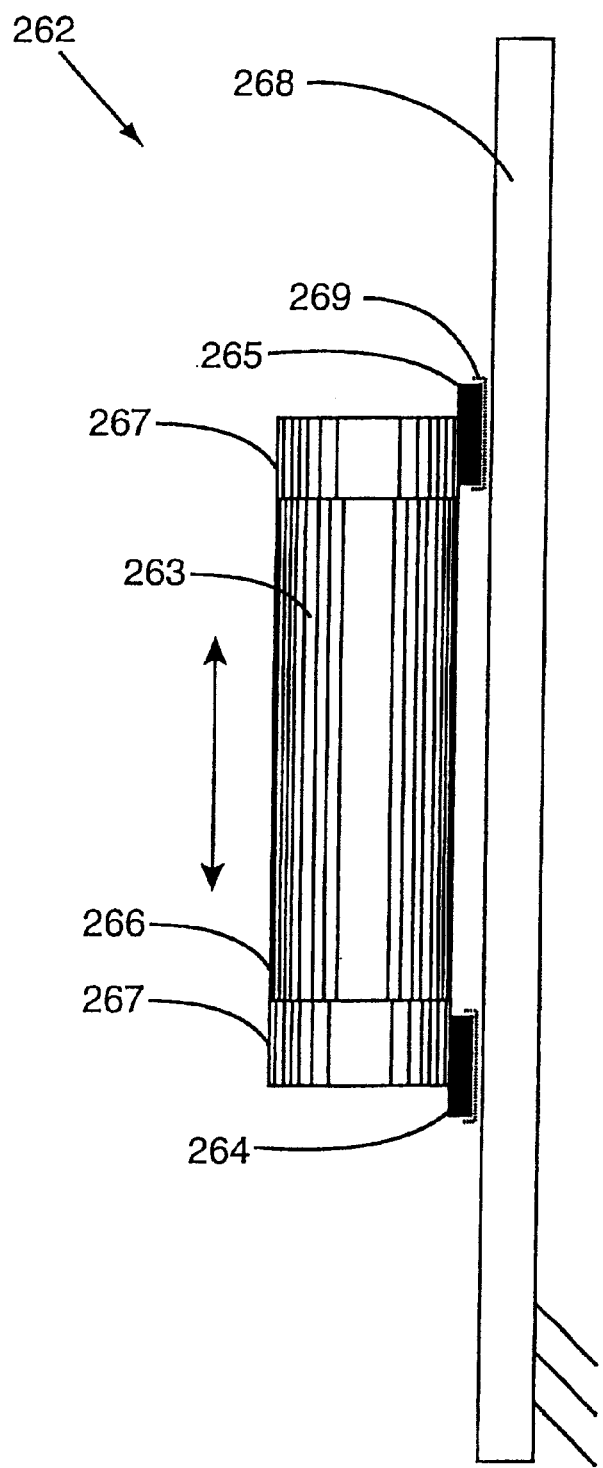
FIG. 2I illustrates an inchworm-type actuator including a rolled electroactive polymer in accordance with one embodiment of the present invention.

FIG. 2I illustrates an inchworm-type actuator 262 in accordance with a specific embodiment of the present invention. The inchworm-type actuator 262 includes two or more rolled pre-strained polymer layers with electrodes 263 that deflect axially along its cylindrical axis. The inchworm-type actuator 262 also includes electrostatic clamps 264 and 265 for attaching and detaching to a metal surface 268. The electrostatic clamps 264 and 265 allow the total stroke for the inchworm-type actuator 262 to be increased compared to an actuator without clamping. As the clamping force per unit weight for the electrostatic clamps 264 and 265 is high, the force per unit weight advantages of pre-strained polymers of the present invention are preserved with the inchworm-type actuator 262. The electrostatic clamps 264 and 265 are attached to the inchworm-type actuator at connection regions 267. A body 266 of the inchworm-type actuator includes the connection regions 267 and the polymer 263 and has a degree of freedom along the axial direction of the rolled polymer 263 between the connection regions 267. In one embodiment, the electrostatic clamps 264 and 265 include an insulating adhesive 269 that prevents electrical shorting from the conductive electrostatic clamps 264 and 265 to the metal surface 268.

The inchworm-type actuator 262 moves upward in a six step process. In step one, the inchworm-type actuator 262 is immobilized at its respective ends when both electrostatic clamps 264 and 265 are actuated and the polymer 263 is relaxed. An electrostatic clamp is actuated by applying a voltage difference between the clamp and the metal surface 268. In step two, clamp 265 is released. Releasing one of the clamps 264 and 265 allows its respective end of the inchworm-type actuator 262 to move freely. In step three, the electroactive polymer 263 is actuated and extends the inchworm-type actuator 262 upward. In step four, clamp 265 is actuated and the inchworm-type actuator 262 is immobilized. In step five, clamp 264 is released. In step six, the polymer 263 is relaxed and the inchworm-type actuator 262 contracts. By cyclically repeating steps one through six, the inchworm-type actuator 262 moves in the upward direction. By switching clamps 264 and 265 in the above six step process, the inchworm-type actuator 262 moves in a reverse direction.

Although the inchworm-type actuator 262 has been described in terms of actuation using a single electroactive polymer and two clamps, multiple segment inchworm-type actuators using multiple electroactive polymers may be implemented. Multiple segment inchworm-type actuators allow an inchworm-type actuator to increase in length without becoming thicker. A two-segment inchworm-type actuator would use two rolled polymers rather than one and three clamps rather than two. In general, an n-segment inchworm-type actuator comprises n actuators between n+1 clamps.

Figure 2J:
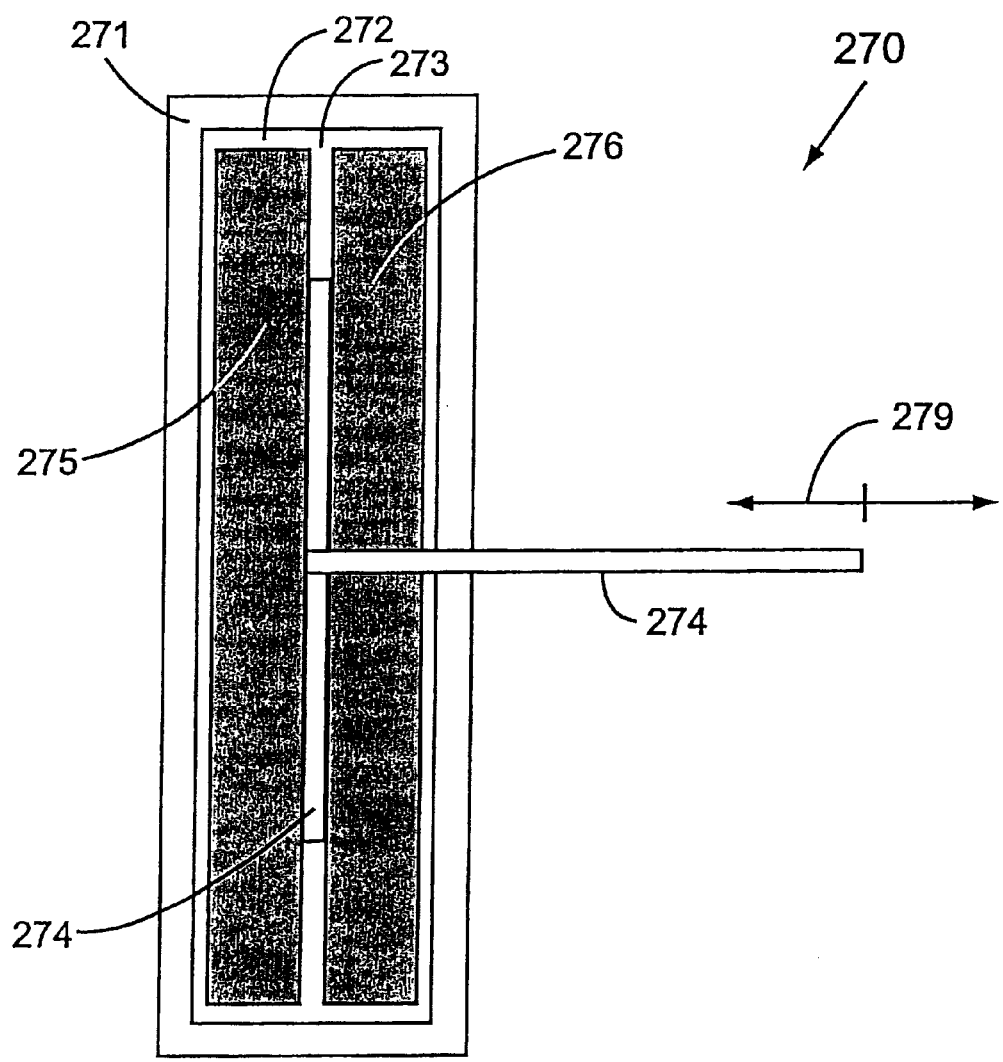
FIG. 2J illustrates a stretched film actuator for providing deflection in one direction in accordance with another embodiment of the present invention.

FIG. 2J illustrates a stretched film actuator 270 for providing linear deflection in accordance with another embodiment of the present invention. The stretched film actuator 270 includes a rigid frame 271 having a hole 272. A pre-strained polymer 273 is attached in tension to the frame 271 and spans the hole 272. A rigid bar 274 is attached to the center of the polymer 273 and provides external displacement corresponding to deflection of the polymer 273. Compliant electrode pairs 275 and 276 are patterned on both top and bottom surfaces of the polymer 273 on the left and right sides respectively of the rigid bar 274. When the electrode pair 275 is actuated, a portion of the polymer 273 between and in the vicinity of the top and bottom electrode pair 275 expands relative to the rest of the polymer 273 and the existing tension in the remainder of the polymer 273 pulls the rigid bar 274 to move to the right. Conversely, when the electrode pair 276 is actuated, a second portion of the polymer 273 affected by the electrode pair 276 expands relative to the rest of the polymer 273 and allows the rigid bar 274 to move to the left. Alternating actuation of the electrodes 275 and 276 provides an effectively larger total stroke 279 for the rigid bar 274. One variation of this actuator includes adding anisotropic pre-strain to the polymer such that the polymer has high pre-strain (and stiffness) in the direction perpendicular to the rigid bar displacement. Another variation is to eliminate one of the electrode pairs. For the benefit of simplifying the design, this variation reduces the stroke 279 for the stretched film actuator 270. In this case, the portion of the polymer no longer used by the removed electrode now responds passively like a restoring spring.

Figure 2K:
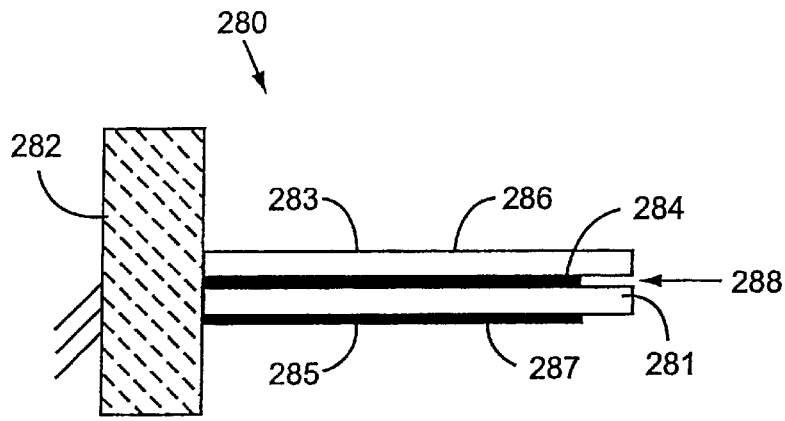
FIG. 2K illustrates a bending beam actuator in accordance with another embodiment of the present invention.
Figure 2L:
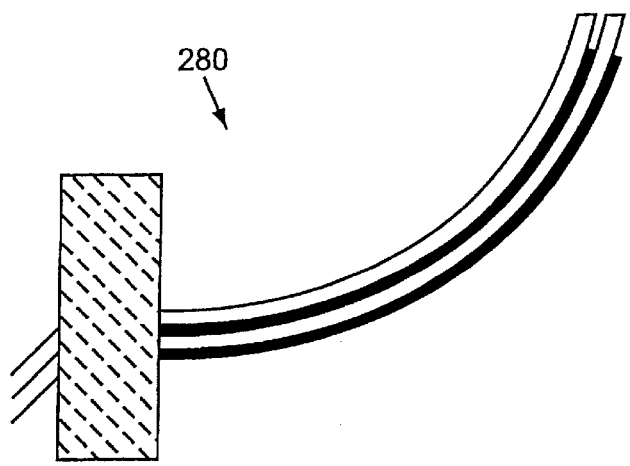
FIG. 2L illustrates the bending beam actuator of FIG. 2K with a 90 degree bending angle.

FIG. 2K illustrates a bending beam actuator 280 in accordance with another embodiment of the present invention. The bending beam actuator 280 includes a polymer 281 fixed at one end by a rigid support 282 and attached to a flexible thin material 283 such as polyimide or mylar using an adhesive layer, for example. The flexible thin material 283 has a modulus of elasticity greater than the polymer 281. The difference in modulus of elasticity for the top and bottom sides 286 and 287 of the bending beam actuator 280 causes the bending beam actuator 280 to bend upon actuation. Electrodes 284 and 285 are attached to the opposite sides of the polymer 281 to provide electrical energy. The bending beam actuator 280 includes a free end 288 having a single bending degree of freedom. Deflection of the free end 288 may be measured by the difference in angle between the free end 288 and the end fixed by the rigid support 282. FIG. 2L illustrates the bending beam actuator 280 with a 90 degree bending angle.

The maximum bending angle for the bending beam actuator 280 will vary with a number of factors including the polymer material, the actuator length, the bending stiffness of the electrodes 284 and 285 and flexible thin material 283, etc. For a bending beam actuator 280 comprising Dow Corning HS3 silicone, gold electrodes and an active area of 3.5 mm in length, bending angles over 225 degrees are attainable. For the bending beam actuator 280, as the length of the active area increases, increased bending angles are attainable. Correspondingly, by extending the active length of the above mentioned bending beam actuator to 5 mm allows for a bending angle approaching 360 degrees.

In one embodiment, one of the electrodes may act as the flexible thin material 283. Any thin metal, such as gold, having a low bending stiffness and a high tensile stiffness may be suitable for an electrode acting as the flexible thin material 283. In another embodiment, a barrier layer is attached between one of the electrodes 284 and 285 and the polymer 281 to minimize the effect of any localized breakdown in the polymer. Breakdown may be defined as the point at which the polymer cannot sustain the applied voltage. The barrier layer is typically thinner than the polymer 281 and has a higher dielectric constant than the polymer 281 such that the voltage drop mainly occurs across the polymer 281. It is often preferable that the barrier layer have a high dielectric breakdown strength.

Figure 2M:
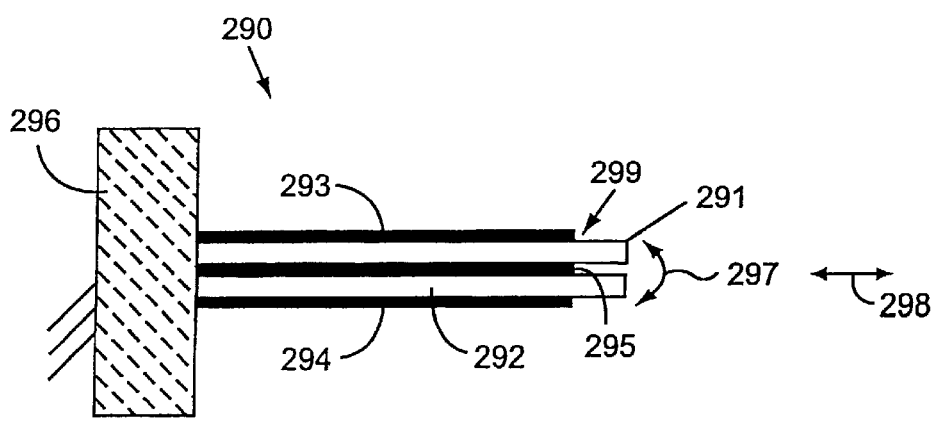
FIG. 2M illustrates a bending beam actuator including two polymer layers in accordance with another embodiment of the present invention.

FIG. 2M illustrates a bending beam actuator 290 in accordance with another embodiment of the present invention. The bending beam actuator 290 includes top and bottom pre-strained polymers 291 and 292 fixed at one end by a rigid support 296. Each of the polymers 291 and 292 may be independently actuated. Independent actuation is achieved by separate electrical control of top and bottom electrodes 293 and 294 attached to the top and bottom electroactive polymers 291 and 292, respectively. A common electrode 295 is situated between the top and bottom electroactive polymers 291 and 292 and attached to both. The common electrode 295 may be of sufficient stiffness to maintain the pre-strain on the polymer layers 291 and 292 while still permitting extension and bending.

Actuating the top electroactive polymer 291 using the top pair of electrodes 293 and 295 causes the bending beam actuator 290 to bend downward. Actuating the bottom polymer 292 using the bottom pair of electrodes 294 and 295 causes the bending beam actuator 290 to bend upward. Thus, independent use of the top and bottom electroactive polymers 291 and 292 allows the bending beam actuator 290 to be controlled along a radial direction 297. When both top and bottom polymers 291 and 292 are actuated simultaneously—and are of substantially similar size and material—the bending beam actuator 290 extends in length along the linear direction 298. Combining the ability to control motion in the radial direction 297 and the linear direction 298, the bending beam actuator 290 becomes a two-degree-of-freedom actuator. Correspondingly, independent actuation and control of the top and bottom polymers 291 and 292 allows a free end 299 of the bending beam actuator 290 to execute complex motions such as circular or elliptical paths.

4. PERFORMANCE

A transducer in accordance with the present invention converts between electrical energy and mechanical energy. Transducer performance may be characterized in terms of the transducer by itself, the performance of the transducer in an actuator, or the performance of the transducer in a specific application (e.g., a number of transducers implemented in a motor). Pre-straining electroactive polymers in accordance with the present invention provides substantial improvements in transducer performance.

Characterizing the performance of a transducer by itself usually relates to the material properties of the polymer and electrodes. Performance of an electroactive polymer may be described independent of polymer size by parameters such as strain, energy density, actuation pressure, actuation pressure density and efficiency. It should be noted that the performance characterization of pre-strained polymers and their respective transducers described below may vary for different electroactive polymers and electrodes.

Pre-strained polymers of the present invention may have an effective modulus in the range of about 0.1 to about 100 MPa. Actuation pressure is defined as the change in force within a pre-strained polymer per unit cross-sectional area between actuated and unactuated states. In some cases, pre-strained polymers of the present invention may have an actuation pressure in the range of about 0 to about 100 MPa, and more preferably in the range 0.1 to 10 MPa. Specific elastic energy density - defined as the energy of deformation of a unit mass of the material in the transition between actuated and unactuated states—may also be used to describe an electroactive polymer where weight is important. Pre-strained polymers of the present invention may have a specific elastic energy density of over 3 J/g.

The performance of a pre-strained polymer may also be described, independent of polymer size, by efficiency. Electromechanical efficiency is defined as the ratio of mechanical output energy to electrical input energy. Electromechanical efficiency greater than 80 percent is achievable with some pre-strained polymers of the present invention. The time for a pre-strained polymer to rise (or fall) to its maximum (or minimum) actuation pressure is referred to as its response time. Pre-strained polymer polymers in accordance with the present invention may accommodate a wide range of response times. Depending on the size and configuration of the polymer, response times may range from about 0.01 milliseconds to 1 second, for example. A pre-strained polymer excited at a high rate may also be characterized by an operational frequency. In one embodiment, maximum operational frequencies suitable for use with the present invention may be in the range of about 100 Hz to 100 kHz. Operational frequencies in this range allow pre-strained polymers of the present invention to be used in various acoustic applications (e.g., speakers). In some embodiments, pre-strained polymers of the present invention may be operated at a resonant frequency to improve mechanical output.

Performance of an actuator may be described by a performance parameter specific to the actuator. By way of example, performance of an actuator of a certain size and weight may be quantified by parameters such as stroke or displacement, force, actuator response time. Characterizing the performance of a transducer in an application relates to how well the transducer is embodied in a particular application (e.g. in robotics). Performance of a transducer in an application may be described by a performance parameter specific to the application (e.g., force/unit weight in robotic applications). Application specific parameters include stroke or displacement, force, actuator response time, frequency response, efficiency, etc. These parameters may depend on the size, mass and/or the design of the transducer and the particular application.

It should be noted that desirable material properties for an electroactive polymer may vary with an actuator or application. To produce a large actuation pressures and large strain for an application, a pre-strained polymer may be implemented with one of a high dielectric strength, a high dielectric constant, and a low modulus of elasticity. Additionally, a polymer may include one of a high-volume resistivity and low mechanical damping for maximizing energy efficiency for an application.

5. ELECTRODES

As mentioned above, transducers of the present invention preferably include one or more electrodes for actuating an electroactive polymer. Generally speaking, electrodes suitable for use with the present invention may be of any shape and material provided they are able to supply or receive a suitable voltage, either constant or varying over time, to or from an electroactive polymer. In one embodiment, the electrodes adhere to a surface of the polymer. Electrodes adhering to the polymer are preferably compliant and conform to the changing shape of the polymer. The electrodes may be only applied to a portion of an electroactive polymer and define an active area according to their geometry.

The compliant electrodes are capable of deflection in one or more directions. Linear strain may be used to describe the deflection of a compliant electrode in one of these directions. As the term is used herein, linear strain of a compliant electrode refers to the deflection per unit length along a line of deflection. Maximum linear strains (tensile or compressive) of at least about 50 percent are possible for compliant electrodes of the present invention. For some compliant electrodes, maximum linear strains of at least about 100 percent are common. Of course, an electrode may deflect with a strain less than the maximum. In one embodiment, the compliant electrode is a 'structured electrode' that comprises one or more regions of high conductivity and one or more regions of low conductivity.

Figure 3:
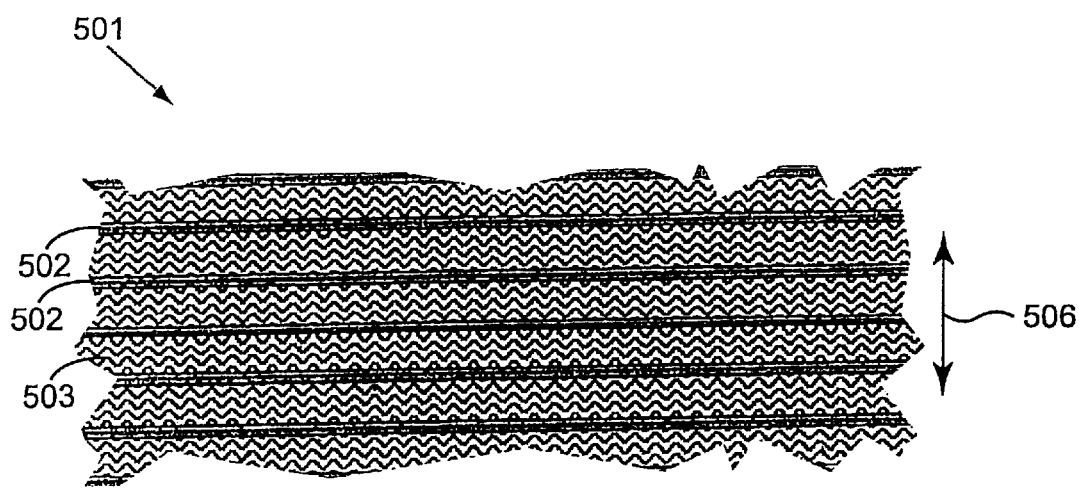
FIG. 3 illustrates a structured electrode that provides one-directional compliance according to a specific embodiment of the present invention.

FIG. 3 illustrates a top surface view of a structured electrode 501 that provides one-directional compliance in accordance with one embodiment of the present invention. The structured electrode 501 includes metal traces 502 patterned in parallel lines over a charge distribution layer 503—both of which cover an active area of a polymer (not shown). The metal traces 502 and charge distribution layer 503 are applied to opposite surfaces of the polymer. Thus, the cross section, from top to bottom, of a transducer including structured electrodes 501 on opposite surfaces is: top metal traces, top charge distribution layer, polymer, bottom charge distribution layer, bottom metal traces. Metal traces 502 on either surface of the polymer act as electrodes for electroactive polymer material between them. In another embodiment, the bottom electrode may be a compliant, uniform electrode. The charge distribution layer 503 facilitates distribution of charge between metal traces 502. Together, the high conductivity metal traces 502 quickly conduct charge across the active area to the low conductivity charge distribution layer 503 which distributes the charge uniformly across the surface of the polymer between the traces 502. The charge distribution layer 503 is compliant. As a result, the structured electrode 501 allows deflection in a compliant direction 506 perpendicular to the parallel metal traces 502.

Actuation for the entire polymer may be achieved by extending the length of the parallel metal traces 502 across the length of the polymer and by implementing a suitable number of traces 502 across the polymer width. In one embodiment, the metal traces 502 are spaced at intervals in the order of 400 micrometers and have a thickness of about 20 to 100 nanometers. The width of the traces is typically much less than the spacing. To increase the overall speed of response for the structured electrode 501, the distance between metal traces 502 may be reduced. The metal traces 502 may comprise gold, silver, aluminum and many other metals and relatively rigid conductive materials. In one embodiment, metal traces on opposite surfaces of an electroactive polymer are offset from one another to improve charge distribution through the polymer layer and prevent direct metal-to-metal electrical breakdowns.

Deflection of the parallel metal traces 502 along their axis greater than the elastic allowance of the metal trace material may lead to damage of the metal traces 502. To prevent damage in this manner, the polymer may be constrained by a rigid structure that prevents deflection of the polymer and the metal traces 502 along their axis. The rigid members 232 of the linear motion actuator of FIGS. 2D and 2E are suitable in this regard. In another embodiment, the metal traces 502 may be undulated slightly on the surface of the polymer 500. These undulations add compliance to the traces 502 along their axis and allow deflection in this direction.

In general, the charge distribution layer 503 has a conductance greater than the electroactive polymer but less than the metal traces. The non-stringent conductivity requirements of the charge distribution layer 503 allow a wide variety of materials to be used. By way of example, the charge distribution layer may comprise carbon black, fluoroelastomer with colloidal silver, a water-based latex rubber emulsion with a small percentage in mass loading of sodium iodide, and polyurethane with tetrathiafulavalene/ tetracyanoquinodimethane (TTF/TCNQ) charge transfer complex. These materials are able to form thin uniform layers with even coverage and have a surface conductivity sufficient to conduct the charge between metal traces 502 before substantial charge leaks into the surroundings. In one embodiment, material for the charge distribution layer 503 is selected based on the RC time constant of the polymer. By way of example, surface resistivity for the charge distribution layer 503 suitable for the present invention may be in the range of $10^6$–$10^{11}$ ohms. It should also be noted that in some embodiments, a charge distribution layer is not used and the metal traces 502 are patterned directly on the polymer. In this case, air or another chemical species on the polymer surface may be sufficient to carry charge between the traces. This effect may be enhanced by increasing the surface conductivity through surface treatments such as plasma etching or ion implantation.

In another embodiment, multiple metal electrodes are situated on the same side of a polymer and extend the width of the polymer. The electrodes provide compliance in the direction perpendicular to width. Two adjacent metal electrodes act as electrodes for polymer material between them. The multiple metal electrodes alternate in this manner and alternating electrodes may be in electrical communication to provide synchronous activation of the polymer.

Figure 4:
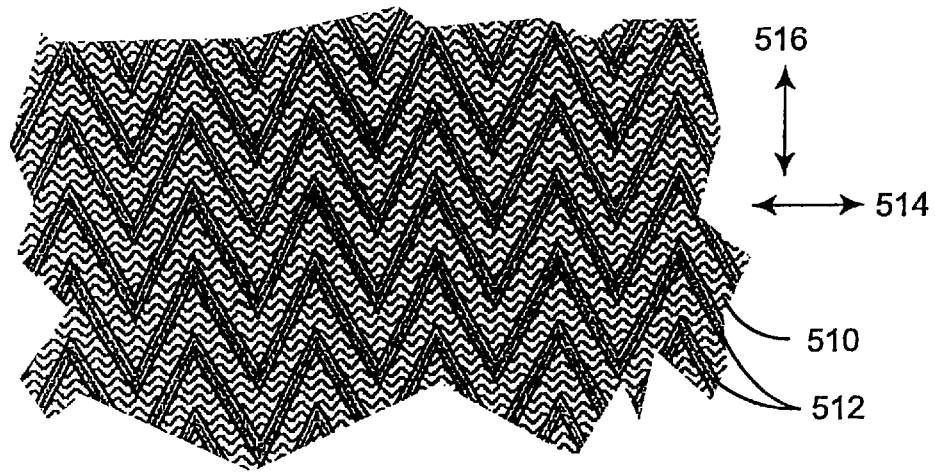
FIG. 4 illustrates a pre-strained polymer comprising a structured electrode that is not directionally compliant according to a specific embodiment of the present invention.

FIG. 4 illustrates a pre-strained polymer 510 underlying a structured electrode that is not directionally compliant according to a specific embodiment of the present invention. The structured electrode includes metal traces 512 patterned directly on one surface of the electroactive polymer 510 in evenly spaced parallel lines forming a 'zig-zag' pattern. Two metal traces 512 on opposite surfaces of the polymer act as electrodes for the electroactive polymer 510 material between them. The 'zig-zag' pattern of the metal traces 512 allows for expansion and contraction of the polymer and the structure electrode in multiple directions 514 and 516.

Using an array of metal traces as described with respect to FIGS. 3 and 4 permits the use of charge distribution layers having a lower conductance. More specifically, as the spacing between metal traces decreases, the required conductance of the material between the traces may diminish. In this manner, it is possible to use materials that are not normally considered conductive to be used as a charge distribution layers. By way of example, polymers having a surface resistivity of $10^{10}$ ohms may be used as an charge distribution layer in this manner. In a specific embodiment, rubber was used as a charge distribution layer as part of a structured electrode on a polymer layer having a thickness of 25 micrometers and spacing between parallel metal traces of about 500 micrometers. In addition to reducing the required conductance for a charge distribution layer, closely spaced metal traces also increase the speed of actuation since the charge need only travel through the charge distribution layer for a short distance between closely spaced metal traces.

Although structured electrodes of the present invention have been described in terms of two specific metal trace configurations; structured electrodes in accordance with the present invention may be patterned in any suitable manner. As one skilled in the art will appreciate, various uniformly distributed metallic trace patterns may provide charge on the surface of a polymer while providing compliance in one or more directions. In some cases, a structured electrode may be attached to the surface of polymer in a non-uniform manner. As actuation of the polymer may be limited to an active region within suitable proximity of a pair of patterned metal traces, specialized active and non-active regions for an electroactive polymer may be defined by custom patterning of the metal traces. These active and non-active regions may be formed to custom geometries and high resolutions according to conventional metal trace deposition techniques. Extending this practice across the entire surface of an electroactive polymer, custom patterns for structured electrodes comprising numerous custom geometry active regions may result in specialized and non-uniform actuation of the electroactive polymer according to the pattern of the structured electrodes.

Figure 5:
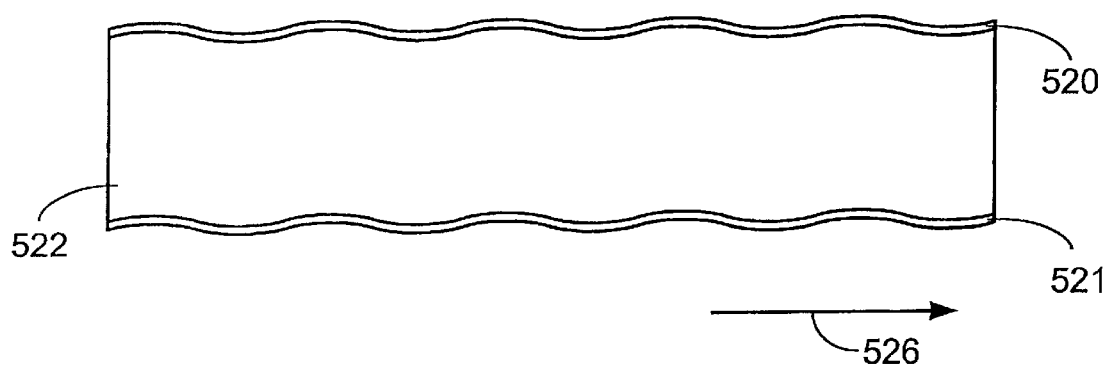
FIG. 5 illustrates textured electrodes in accordance with one embodiment of the present invention.

Although the present invention has been discussed primarily in terms of flat electrodes, 'textured electrodes' comprising varying out of plane dimensions may be used to provide a compliant electrode. FIG. 5 illustrates exemplary textured electrodes 520 and 521 in accordance with one embodiment of the present invention. The textured electrodes 520 and 521 are attached to opposite surfaces of an electroactive polymer 522 such that deflection of the polymer 522 results in planar and non-planar deformation of the textured electrodes 520 and 521. The planar and non-planar compliance of the electrodes 520 and 521 is provided by an undulating pattern which, upon planar and/or thickness deflection of the polymer 522, provides directional compliance in a direction 526. To provide substantially uniform compliance for the textured electrodes 520 and 521, the undulating pattern is implemented across the entire surface of the electroactive polymer in the direction 526. In one embodiment, the textured electrodes 520 and 521 are comprised of metal having a thickness which allows bending without cracking of the metal to provide compliance. Typically, the textured electrode 520 is configured such that non-planar deflection of the electrodes 520 and 521 is much less than the thickness of the polymer 522 in order to provide a substantially constant electric field to the polymer 522. Textured electrodes may provide compliance in more than one direction. In a specific embodiment, a rough textured electrode provides compliance in orthogonal planar directions. The rough textured electrode may have a topography similar to the rough surface of FIG. 1D.

In one embodiment, compliant electrodes of the present invention comprise a conductive grease such as carbon grease or silver grease. The conductive grease provides compliance in multiple directions. Particles may be added to increase the conductivity of the polymer. By way of example, carbon particles may be combined with a polymer binder such as silicone to produce a carbon grease that has low elasticity and high conductivity. Other materials may be blended into the conductive grease to alter one or more material properties. Conductive greases in accordance with the present invention are suitable for deflections of at least about 100 percent strain.

Compliant electrodes of the present invention may also include colloidal suspensions. Colloidal suspensions contain submicrometer sized particles, such as graphite, silver and gold, in a liquid vehicle. Generally speaking, any colloidal suspension having sufficient loading of conductive particles may be used as an electrode in accordance with the present invention. In a specific embodiment, a conductive grease including colloidal sized conductive particles is mixed with a conductive silicone including colloidal sized conductive particles in a silicone binder to produce a colloidal suspension that cures to form a conductive semi-solid. An advantage of colloidal suspensions is that they may be patterned on the surface of a polymer by spraying, dip coating and other techniques that allow for a thin uniform coating of a liquid. To facilitate adhesion between the polymer and an electrode, a binder may be added to the electrode. By way of example, a water-based latex rubber or silicone may be added as a binder to a colloidal suspension including graphite.

In another embodiment, compliant electrodes are achieved using a high aspect ratio conductive material such as carbon fibrils and carbon nanotubes. These high aspect ratio carbon materials may form high surface conductivities in thin layers. High aspect ratio carbon materials may impart high conductivity to the surface of the polymer at relatively low electrode thicknesses due to the high interconnectivity of the high aspect ratio carbon materials. By way of example, thicknesses for electrodes made with common forms of carbon that are not high-aspect ratio may be in the range of 5–50 micrometers while thicknesses for electrodes made with carbon fibril or carbon nanotube electrodes may be less than 2–4 micrometers. Area expansions well over 100 percent in multiple directions are suitable with carbon fibril and carbon nanotube electrodes on acrylic and other polymers. High aspect ratio carbon materials may include the use of a polymer binder to increase adhesion with the electroactive polymer layer. Advantageously, the use of polymer binder allows a specific binder to be selected based on adhesion with a particular electroactive polymer layer and based on elastic and mechanical properties of the polymer.

In one embodiment, high-aspect-ratio carbon electrodes may be fabricated thin enough such that the opacity of the electrodes may be varied according to polymer deflection. By way of example, the electrodes may be made thin enough such that the electrode changes from opaque to semitransparent upon planar expansion. This ability to manipulate the opacity of the electrode may allow transducers of the present invention to be applied to a number of various optical applications as will be described below.

In another embodiment, mixtures of ionically conductive materials may be used for the compliant electrodes. This may include, for example, water based polymer materials such as glycerol or salt in gelatin, iodine-doped natural rubbers and water-based emulsions to which organic salts such as potassium iodide are added. For hydrophobic electroactive polymers that may not adhere well to a water based electrode, the surface of the polymer may be pretreated by plasma etching or with a fine powder such as graphite or carbon black to increase adherence.

Materials used for the electrodes of the present invention may vary greatly. Suitable materials used in an electrode may include graphite, carbon black, colloidal suspensions, thin metals including silver and gold, silver filled and carbon filled gels. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as Circuit Works 7200 as provided by ChemTronics Inc. of Kennesaw, Ga. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. By way of example, carbon fibrils work well with acrylic elastomer polymers while not as well with silicone polymers. For most transducers, desirable properties for the compliant electrode may include any one of a low modulus of elasticity, low mechanical damping, a low surface resistivity, uniform resistivity, chemical and environmental stability, chemical compatibility with the electroactive polymer, good adherence to the electroactive polymer, and an ability to form smooth surfaces. In some cases, it may be desirable for the electrode material to be suitable for precise patterning during fabrication. By way of example, the compliant electrode may be spray coated onto the polymer. In this case, material properties which benefit spray coating would be desirable. In some cases, a transducer of the present invention may implement two different types of electrodes. By way of example, a diaphragm actuator of the present invention may have a structured electrode attached to its top surface and a high aspect ratio carbon material deposited on the bottom side.

Electronic drivers are connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. By way of example, a transducer used in an audio application may be driven by a signal of up to 200 to 1000 volts peak to peak on top of a bias voltage ranging from about 750 to 2000 volts DC.

6. APPLICATIONS

As the present invention includes transducers that may be implemented in both the micro and macro scales, and with a wide variety of actuator designs, the present invention finds use in a broad range of applications where electrical energy is converted into mechanical energy. Provided below are several exemplary applications for some of the actuators described above. Broadly speaking, the transducers and actuators of the present invention may find use in any application requiring conversion from mechanical to electrical energy.

As mentioned before, electroactive polymers, either individually or mechanically linked in a collection, may be referred to as artificial muscle. The term artificial muscle in itself implies that these actuators are well-suited for application to biologically inspired robots or biomedical applications where the duplication of muscle, mammalian or other, is desired. By way of example, applications such as prosthetic limbs, exoskeletons, and artificial hearts may benefit from pre-strained polymers of the present invention. The size scalability of electroactive polymers and the ability to use any number of transducers or polymer actuators in a collection allow artificial muscle in accordance with the present invention to be used in a range in applications greater than their biological counterparts. As transducers and actuators of the present invention have a performance range far outside their biological counterparts, the present invention is not limited to artificial muscle having a performance corresponding to real muscle, and may indeed include applications requiring performance outside that of real muscle.

In one example of artificial muscle, a collection of linear motion actuators comprises two or more layers of pre-strained polymer sandwiched together and attached to two rigid plates at opposite edges of each polymer. Electrodes are sealed into the center between each of the polymer layers. All of the linear motion actuators in the collection may take advantage of geometric constraints provided by the rigid plates and anisotropic pre-strain to restrict deformation of the polymer in the actuated direction. An advantage of the layered construction is that as many electroactive polymer layers as required may be stacked in parallel in order to produce the desired force. Further, the stroke of this linear motion actuator configuration may be increased by adding similar linear motion actuators in series.

In the micro domain, the pre-strained polymers may range in thickness from several micrometers to several millimeters and preferably from several micrometers to hundreds of micrometers. Micro pre-strained polymers are well-suited for applications such as inkjets, actuated valves, micropumps, inchworm-type actuators, pointing mirrors, sound generators, microclamps, and micro robotic applications. Micro robotic applications may include micro robot legs, grippers, pointer actuators for CCD cameras, wire feeders for micro welding and repair, clamping actuators to hold rigid positions, and ultrasonic actuators to transmit data over measured distances. In another application, a diaphragm actuator may be implemented in an array of similar electroactive polymer diaphragms in a planar configuration on a single surface. By way of example, an array may include sixty-two diaphragms with the diameter of 150 micrometers each arranged in a planar configuration. In one embodiment, the array of diaphragm actuators may be formed on a silicon wafer. Diaphragm actuator arrays produced in this manner may include, for example, from 5 to 10,000 or more diaphragms each having a diameter in the range of 60 to 150 micrometers. The array may be placed upon grid plates having suitably spaced holes for each diaphragm.

In the macro domain, each of the actuators described above may be well suited to its own set of applications. For example, the inchworm-type actuator of FIG. 2I is suitable for use with small robots capable of navigating through pipes less than 2 cm in diameter. Other actuators are well-suited, for example, with applications such as robotics, solenoids, sound generators, linear actuators, aerospace actuators, and general automation.

In another embodiment, a transducer of the present invention is used as an optical modulation device or an optical switch. The transducer includes an electrode whose opacity varies with deflection. A transparent or substantially translucent pre-strained polymer is attached to the opacity varying electrode and deflection of the polymer is used to modulate opacity of device. In the case of an optical switch, the opacity varying transducer interrupts a light source communicating with a light sensor. Thus, deflection of the transparent polymer causes the opacity varying electrode to deflect and affect the light sensor. In a specific embodiment, the opacity varying electrode includes carbon fibrils or carbon nanotubes that become less opaque as electrode area increases and the area fibril density decreases. In another specific embodiment, an optical modulation device comprised of an electroactive polymer and an opacity varying electrode may be designed to precisely modulate the amount of light transmitted through the device.

Diaphragm actuators may be used as pumps, valves, etc. In one embodiment, a diaphragm actuator having a pre-strained polymer is suitable for use as a pump. Pumping action is created by repeatedly actuating the polymer. Electroactive polymer pumps in accordance with the present invention may be implemented both in micro and macro scales. By way of example, the diaphragm may be used as a pump having a diameter in the range of about 150 micrometers to about 2 centimeters. These pumps may include polymer strains over 100 percent and may produce pressures of 20 kPa or more.

Figure 6:
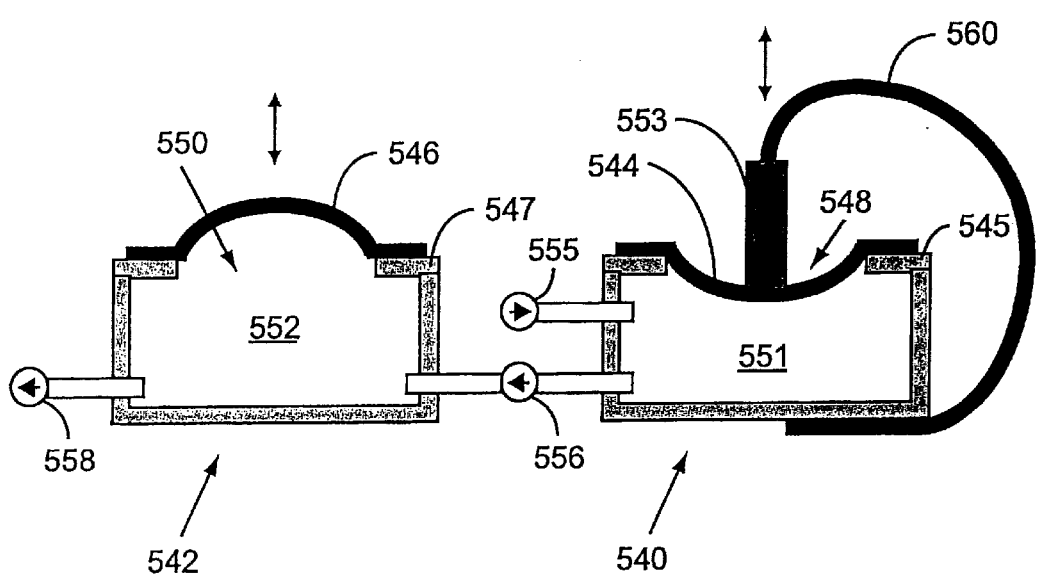
FIG. 6 illustrates a two-stage cascaded pumping system including two diaphragm actuator pumps in accordance with a specific embodiment of the present invention.

FIG. 6 illustrates a two-stage cascaded pumping system including diaphragm pumps 540 and 542 in accordance with a specific embodiment of the present invention. The diaphragm pumps 540 and 542 include pre-strained polymers 544 and 546 attached to frames 545 and 547. The polymers 544 and 546 deflect within holes 548 and 550 in the frames 545 and 547 respectively in a direction perpendicular to the plane of the holes 548 and 550. The frames 545 and 547 along with the polymers 544 and 546 define cavities 551 and 552. The pump 540 includes a plunger 553 having a spring 560 for providing a bias to the diaphragm 544 towards the cavity 551.

A one-way valve 555 permits inlet of a fluid or gas into the cavity 551. A one-way valve 556 permits outlet of the fluid or gas out of the cavity 551 into the cavity 552. In addition, a one-way valve 558 permits exit of the fluid or gas from the cavity 552. Upon actuation of the polymers 544 and 546, the polymers deflect in turn to change the pressure within the cavities 551 and 552 respectively, thereby moving fluid or gas from the one-way valve 555 to the cavity 551, out the valve 556, into the cavity 552, and out the valve 558.

In the cascaded two-stage pumping system of FIG. 6, the diaphragm pump 542 does not include a bias since the pressurized output from the diaphragm pump 540 biases the pump 542. In one embodiment, only the first pump in a cascaded series of diaphragm pumps uses a bias pressure—or any other mechanism for self priming. In some embodiments, diaphragm pumps provided in an array may include voltages provided by electronic timing to increase pumping efficiency. In the embodiment shown in FIG. 6, polymers 544 and 546 are actuated simultaneously for best performance. For other embodiments which may involve more diaphragm pumps in the cascade, the electronic timing for the different actuators is ideally set so that one pump contracts in cavity volume while the next pump in the series (as determined by the one-way valves) expands. In a specific embodiment, the diaphragm pump 540 supplies gas at a rate of 40 ml/min and a pressure about 1 kPa while the diaphragm pump 542 supplies gas at substantially the same flow rate but increases the pressure to 2.5 kPa.

Bending beam actuators, such as those described with respect to FIGS. 2K–2M, may be used in a variety of commercial and aerospace devices and applications such as fans, electrical switches and relays, and light scanners—on the micro and macro level. For bending beam actuators used as light scanners, a reflective surface such as aluminized mylar may be bonded to the free end of a bending beam actuator. More specifically, light is reflected when the bending beam is actuated and light passes when the bending beam is at rest. The reflector may then be used to reflect incoming light and form a scanned beam to form an arc or line according to the deflection of the actuator. Arrays of bending beam actuators may also be used for flat-panel displays, to control airflow over a surface, for low profile speakers and vibration suppressors, as "smart furs" for controlling heat transfer and/or light absorption on a surface, and may act as cilia in a coordinated manner to manipulate objects.

Polymers and polymer films that are rolled into a tubular or multilayer cylinder actuator may be implemented as a piston that expands axially upon actuation. Such an actuator is analogous to a hydraulic or pneumatic piston, and may be implemented in any device or application that uses these traditional forms of linear deflection.

An electroactive polymer actuator may also operate at high speeds for a variety of applications including sound generators and acoustic speakers, inkjet printers, fast MEMS switches etc. In a specific embodiment, an electroactive polymer diaphragm is used as a light scanner. More specifically, a mirror may be placed on a flexure that pushes down on a 5 mm diameter electroactive polymer diaphragm to provide a mirrored flexure. Good scanning of images at a scanning angle from about 10 to 30 degrees may be accomplished with voltages in the range of about 190 to 300 volts and frequencies in the range of about 30 to 300 Hz. Much larger scanning angles, up to 90 degrees for example, may also be accommodated using voltages in the range of 400 to 500 V. In addition, higher frequencies may be used with a stiffer mirrored flexure.

7. FABRICATION

As the pre-strained polymers may be implemented both in the micro and macro scales, in a wide variety of actuator designs, with a wide range of materials, and in a broad range of applications, fabrication processes used with the present invention may vary greatly. In one aspect, the present invention provides methods for fabricating electromechanical devices including one or more pre-strained polymers.

Figure 7A:
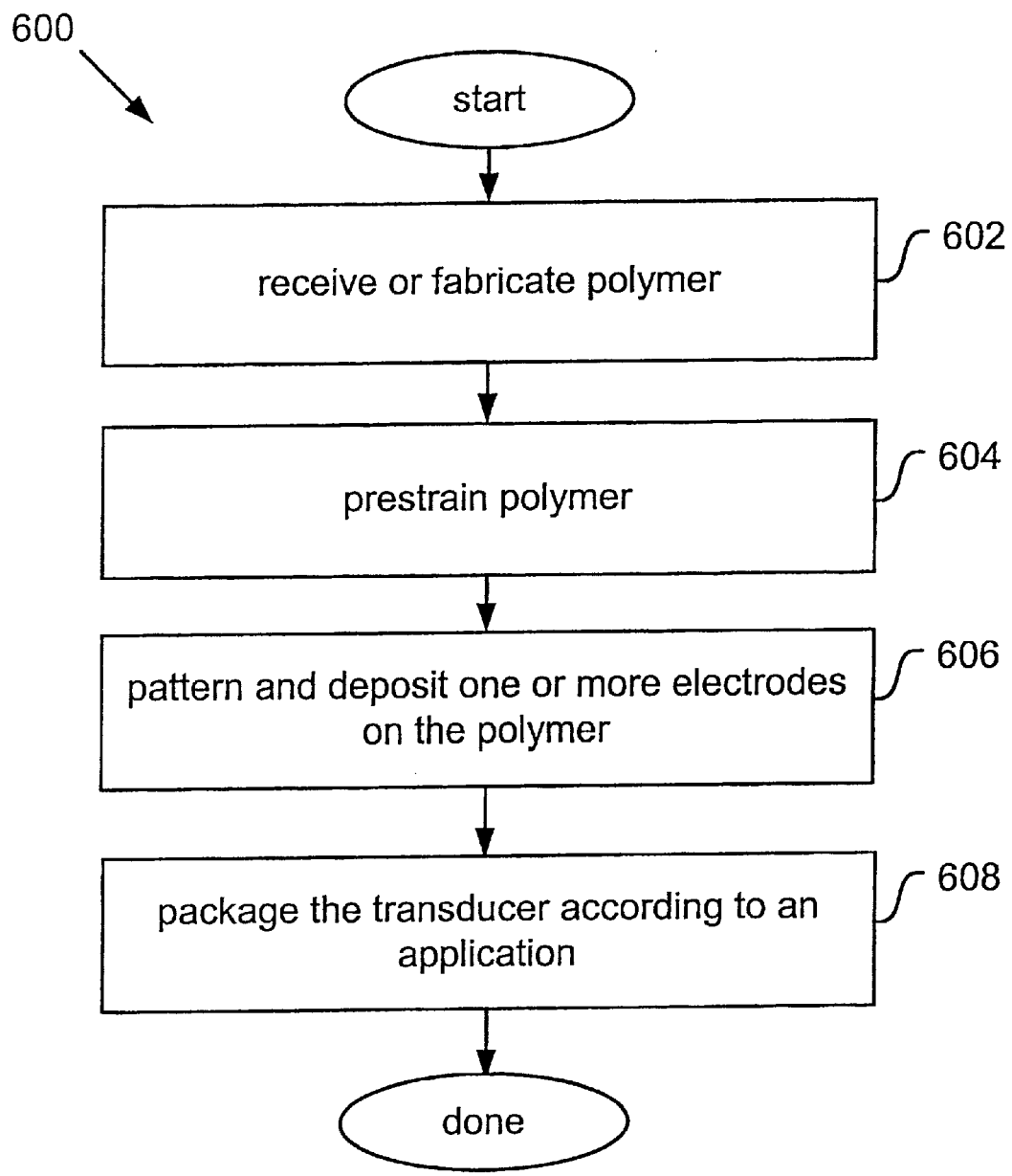
FIG. 7A illustrates a process flow for fabricating an electromechanical device having at least one pre-strained polymer in accordance with one embodiment of the present invention.
Figure 7B:
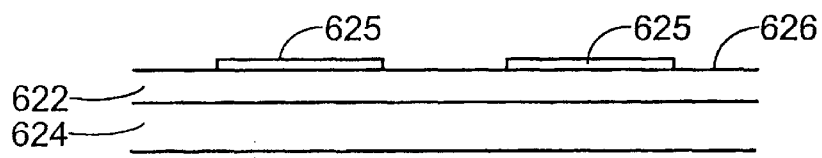
FIGS. 7B–F illustrate a process for fabricating an electromechanical device having multiple polymer layers in accordance with one embodiment of the present invention.
Figure 7C:
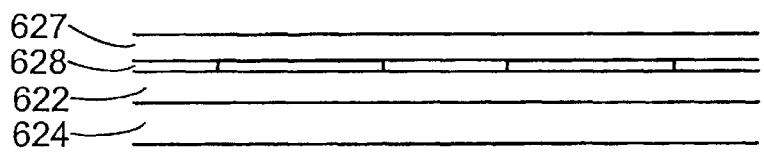

FIG. 7A illustrates a process flow 600 for fabricating an electromechanical device having at least one electroactive polymer layer in accordance with one embodiment of the present invention. Processes in accordance with the present invention may include up to several additional steps not described or illustrated here in order not to obscure the present invention. In some cases, fabrication processes of the present invention may include conventional materials and techniques such as commercially available polymers and techniques used in fabrication of microelectronics and electronics technologies. For example, micro diaphragm actuators may be produced in situ on silicon using conventional techniques to form the holes and apply the polymer and electrodes.

The process flow 600 begins by receiving or fabricating a polymer (602). The polymer may be received or fabricated according to several methods. In one embodiment, the polymer is a commercially available product such as a commercially available acrylic elastomer film. In another embodiment, the polymer is a film produced by one of casting, dipping, spin coating or spraying. In one embodiment, the polymer is produced while minimizing variations in thickness or any other defects that may compromise the maximize electric field that can be applied across the polymer and thus compromise performance.

Spin coating typically involves applying a polymer mixture on a rigid substrate and spinning to a desired thickness. The polymer mixture may include the polymer, a curing agent and a volatile dispersant or solvent. The amount of dispersant, the volatility of the dispersant, and the spin speed may be altered to produce a desired polymer. By way of example, polyurethane films may be spin coated in a solution of polyurethane and tetrahydrofuran (THF) or cyclohexanone. In the case of silicon substrates, the polymer may be spin coated on an aluminized plastic or a silicon carbide. The aluminum and silicon carbide form a sacrificial layer that is subsequently removed by a suitable etchant. Films in the range of one micrometer thick may been produced by spin coating in this manner. Spin coating of polymer films, such as silicone, may be done on a smooth non-sticking plastic substrate, such as polymethyl methacrylate or teflon. The polymer film may then be released by mechanically peeling or with the assistance of alcohol or other suitable release agent. Spin coating is also suitable for producing thicker polymers in the range of 10–750 micrometers. In some cases, the polymer mixture may be centrifuged prior to spin coating to remove unwanted materials such as fillers, particulates, impurities and pigments used in commercial polymers. To increase centrifuge efficacy or to improve thickness consistency, a polymer may be diluted in a solvent to lower its viscosity; e.g. silicone may be disbursed in naptha.

The polymer may then be pre-strained in one or more directions (604). In one embodiment, pre-strain is achieved by mechanically stretching a polymer in or more directions and fixing it to one or more solid members (e.g., rigid plates) while strained. Another technique for maintaining pre-strain includes the use of one or more stiffeners. The stiffeners are long rigid structures placed on a polymer while it is in a pre-strained state, e.g. while it is stretched. The stiffeners maintain the pre-strain along their axis. The stiffeners may be arranged in parallel or other configurations to achieve directional compliance of the transducer. It should be noted that the increased stiffness along the stiffener axis comprises the increased stiffness provided by the stiffener material as well as the increased stiffness of the polymer in the pre-strain direction.

Surfaces on the pre-strained polymer may be textured. In one embodiment to provide texturing, a polymer is stretched more than it can stretch when actuated, and a thin layer of stiff material is deposited on the stretched polymer surface. For example, the stiff material may be a polymer that is cured while the electroactive polymer is stretched. After curing, the electroactive polymer is relaxed and the structure buckles to provide the textured surface. The thickness of the stiff material may be altered to provide texturing on any scale, including submicrometer levels. In another embodiment, textured surfaces are produced by reactive ion etching (RIE). By way of example, RIE may be performed on a pre-strained polymer comprising silicon with an RIE gas comprising 90 percent carbon tetrafluoride and 10 percent oxygen to form a surface with wave troughs and crests 4 to 5 micrometers in depth.

One or more electrodes are then formed on the polymer (606). For the silicone polymer altered by RIE mentioned above, a thin layer of gold may be sputter deposited on the RIE textured surface to provide a textured electrode. In another embodiment, one or more graphite electrodes may be patterned and deposited using a stencil. Electrodes comprising conductive greases mixed with a conductive silicone may be fabricated by dissolving the conductive grease and the uncured conductive silicone in a solvent. The solution may then be sprayed on the electroactive polymer material and may include a mask or stencil to achieve a particular pattern.

The metal traces of the structured electrodes of FIGS. 3 and 4 may be patterned photolithographically on top of the polymer or charge distribution layer. By way of example, a layer of gold is sputter deposited before depositing a photoresist over the gold. The photoresist and gold may be patterned according to conventional photolithographic techniques, e.g. using a mask followed by one or more rinses to remove the photoresist. A charge distribution layer added between the polymer and the metal traces may be deposited by spin coating, for example.

In a specific embodiment, a structured electrode is formed on a polymer by sputter depositing gold for about 2 to 3 minutes (according to a desired thickness) at about 150 angstroms per minute. HPR 506 photoresist as provided by Arch Chemicals, of Norwalk, Conn. is then spin coated on the gold at about 500 to 1500 rpm for about 20 to 30 seconds and then baked at about 90 degrees Celsius. A mask is then applied before exposing the photoresist to UV light and development to remove unmasked portions of the photoresist. The gold is then etched away and the film is rinsed. The remaining photoresist is removed by exposure to UV light, development and rinsing. The gold traces may then be stretched to enhance strain tolerance.

Textured electrodes of the present invention may also be patterned photolithographically. In this case, a photoresist is deposited on a pre-strained polymer and patterned using a mask. Plasma etching may remove portions of the electroactive polymer not protected by the mask in a desired pattern. The mask may be subsequently removed by a suitable wet etch. The active surfaces of the polymer may then be covered with the thin layer of gold deposited by sputtering, for example.

The transducer, comprising the one or more polymer layers and electrodes, is then packaged according to an application (608). Packaging may also include assembly of multiple transducers mechanically linked or stacked as multiple layers. In addition, mechanical and electrical connections to the transducers may be formed according to an application.

The present invention also provides alternative methods for fabricating electromechanical devices including multiple layers of pre-strained polymer. In one embodiment, a process for fabricating electromechanical devices begins by obtaining or fabricating a polymer layer. The polymer is then stretched to the desired pre-strain and attached to a first rigid frame. Next electrodes are deposited onto both sides of the polymer so as to define active areas and establish electrical connections. The electrodes may be patterned by a variety of well-known techniques such as spray coating through a mask. If desired, a second polymer layer is then stretched on a second frame. Electrodes are then patterned on this second polymer layer. The second polymer layer is then coupled to the first layer by stacking their respective frames. Layers of suitable compliant adhesives may be used to bond the two layers and electrodes, if needed. The size of the frames is chosen so as not to interfere with the polymer layers making intimate contact. If interference is present, then it may be desirable to remove the second frame, e.g., by cutting away the polymer layer around the periphery of the first frame. If desired, a third layer of polymer with electrodes may be added in a manner similar to how the second layer was added to the first. This procedure may be continued until a desired number of layers is reached.

Rigid frames, rigid members or other electrical and mechanical connectors are then attached to the polymer layers, e.g., by gluing. If desired, the polymer may then be removed from the first frame. In some cases, the first frame may serve as a structural part of the final actuator or actuators. For example, the first frame may be an array of holes to produce an array of diaphragm actuators.

FIGS. 7B–F illustrate a second process for fabricating an electromechanical device 640 having multiple layers of electroactive polymer in accordance with another embodiment of the present invention. Processes in accordance with the present invention may include up to several additional steps not described or illustrated here in order not to obscure the present invention. The process begins by producing a pre-strained polymer 622 on a suitable rigid substrate 624, e.g. by spin coating a polymer on a polymethyl methacrylate (PMMA) disk, stretching the polymer (FIG. 7B) and then attaching it to rigid substrate 624. After the polymer 622 is cured, electrodes 625 are patterned on the exposed side 626 of the polymer 622. A solid member 627 such as a flexible film including one of polyimide, mylar or acetate film is then deposited onto the electroactive polymer 622 (FIG. 7C) with a suitable adhesive 628.

Figure 7D:
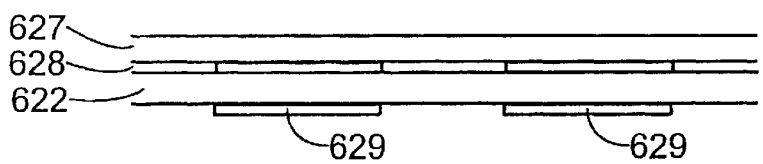
Figure 7E:
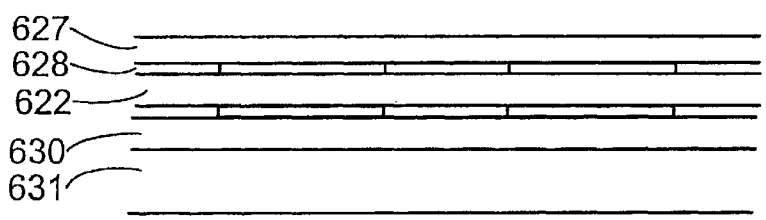

The rigid substrate 624 is then released from the electroactive polymer 622 (FIG. 7D). A releasing agent such as isopropyl alcohol may be used to facilitate the release. Electrodes 629 are then patterned on the previously unexposed side of the polymer 622. The assembly is then bonded to another electroactive polymer layer 630 attached to a rigid substrate 631 (FIG. 7E). Polymer layers 622 and 630 may be bonded by an adhesive layer 632 comprising GE RTV 118 silicone, for example. The rigid substrate 631 is then released from the polymer 630 and electrodes 633 are patterned on the available side 634 of the polymer 630. If additional polymer layers are desired, the steps of adding a polymer layer, removing the rigid substrate, and adding electrodes may be repeated to produce as many polymer layers as desired. Polymer layer 635 has been added in this manner. To facilitate electrical communication to electrodes in the inner layers of the device 640, a metal pin may be pushed through the structure to make contact with electrodes in each layer.

Figure 7F:
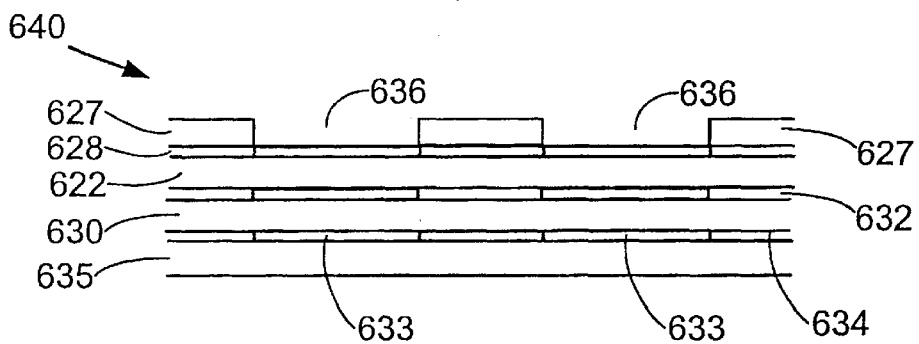

The solid member 627 may then be patterned or removed as needed to provide the frame or mechanical connections required by the specific actuator type. In one embodiment, diaphragm actuators may be formed by patterning solid member 627 to form holes 636 which provide active regions for the electromechanical device 640 using a suitable mask or etch technique (FIG. 7F). In another embodiment, if the active area is not large and electrodes may be added to the active regions of the polymers without damage, the solid member 627 may be patterned with the holes 636 prior to attachment to the polymer 622.

For the process of FIGS. 7B–F, the rigid substrate 624 is typically released from the electroactive polymer 622 by peeling the flexible electroactive polymer. Peeling is well-suited for fabricating devices comprising electroactive polymers with a substantially flat profile. In another embodiment, sacrificial layers may be used between the polymer or electrodes and the rigid substrate to facilitate release. The sacrificial layers allow the polymer, electrodes and attached assembly to be released from a rigid substrate by etching away the sacrificial layer. Metals comprising aluminum and silver are suitable for use as the sacrificial layers, for example. The use of metals allows the sacrificial layers to be etched away by liquids that do not affect the polymer layers. Metal sacrificial layers may also be easily patterned with various masking techniques to provide frames, connectors for other structural components for the electromechanical device 640. The sacrificial layers may also be used to fabricate devices comprising transducers with non flat profiles, e.g. using rigid substrates shaped as tubes. For geometrically complex transducers, sacrificial layers may be used in combination with dip coating to provide the complex geometry.

Although fabrication of pre-strained polymers has been briefly described with respect to a few specific examples, fabrication processes and techniques of the present invention may vary accordingly for any the actuators or applications described above. For example, the process for fabricating a diaphragm actuator in accordance with a specific embodiment may include spin coating a polymer on a substrate before a structured electrode is fabricated on the polymer. The polymer is then stretched and rigid frames including one or more holes sized for the active area of each diaphragm actuator are bonded to the pre-strained polymer, including any overlap portions of the structured electrode. In another embodiment, holes are etched into the substrate instead of using a separate rigid frame, e.g. when the substrate is comprised of silicon. The substrate is then released from the polymer and an electrode is attached to the bottom side of the polymer.

8. CONCLUSION

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. It is therefore intended that the scope of the invention should be determined with reference to the appended claims.

What is claimed is:

1. An electrode for use with an electroactive polymer, the electrode comprising:
a compliant portion in contact with the electroactive polymer, wherein the compliant portion comprises one or more regions of high conductivity and one or more regions of low conductivity, and wherein the compliant portion is capable of deflection with a maximum linear strain of at least about 50 percent.

2. The electrode of claim 1 wherein the regions of high conductivity include a set of metal traces.

3. The electrode of claim 2 wherein the metal traces form one or more specialized active regions.

4. An electrode for use with an electroactive polymer, the electrode comprising:
   a compliant portion in contact with the electroactive polymer, wherein the electrode comprises a colloidal suspension, and wherein the compliant portion is capable of deflection with a maximum linear strain of at least about 50 percent.

5. An electrode for use with an electroactive polymer, the electrode comprising:
   a compliant portion in contact with the electroactive polymer, wherein the electrode comprises a conductive grease, and wherein the compliant portion is capable of deflection with a maximum linear strain of at least about 50 percent.

6. An electrode for use with an electroactive polymer, the electrode comprising:
   a compliant portion in contact with the electroactive polymer, wherein the electrode comprises a mixture of ionically conductive materials, and wherein the compliant portion is capable of deflection with a maximum linear strain of at least about 50 percent.

7. The electrode of claim 1 wherein the compliant portion is capable of deflection with a maximum linear strain of at least about 100 percent.

8. The electrode of claim 1 wherein the one or more regions of high conductivity comprise patterned metal traces.

9. The electrode of claim 8 wherein the one or more regions of low conductivity comprises a charge distribution layer that has a conductance greater than the electroactive polymer and less than the conductance of the patterned metal traces.

10. The electrode of claim 8 wherein the patterned metal traces are offset from patterned metal traces included in a second electrode on an opposing side of the electroactive polymer.

11. The electrode of claim 8 wherein the patterned metal traces are configured to allow expansion and contraction of the electroactive polymer in multiple directions.

12. The electrode of claim 1 wherein the one or more regions of low conductivity has a surface resistivity in the range of about $10^6$ ohms to about $10^{11}$ ohms.

13. The electrode of claim 4 wherein the electrode is patterned to form an active area according to the geometry of the electrode.

14. The electrode of claim 13 wherein the electrode is patterned by spraying the colloidal suspension onto the electroactive polymer.

15. The electrode of claim 4 wherein the colloidal suspension comprises one of graphite, silver and gold.

16. The electrode of claim 4 wherein the colloidal suspension comprises a silicone that improves adhesion between the electroactive polymer and the electrode.

17. The electrode of claim 4 wherein the colloidal suspension comprises a conductive grease.

18. The electrode of claim 17 wherein the colloidal suspension comprises a conductive silicone.

19. The electrode of claim 18 wherein the colloidal suspension is cured to form a conductive semi-solid.

20. The electrode of claim 5 wherein the conductive grease comprises carbon particles.

21. The electrode of claim 5 wherein the compliant portion is capable of deflection with a maximum linear strain of at least about 100 percent.

22. The electrode of claim 6 wherein the mixture of ionically conductive materials comprises a water-based emulsion.

* * * * *